US007391869B2

(12) United States Patent
Eid et al.

(10) Patent No.: US 7,391,869 B2

(45) Date of Patent: Jun. 24, 2008

(54) BASE MANAGEMENT SYSTEMS

(75) Inventors: Bradley F. Eid, Greenwood, IN (US); Hans-Juergen Nitzpon, Waldbronn (DE)

(73) Assignee: Harman International Industries, Incorporated, Northridge, CA (US)

( * ) Notice: Subject to any disclaimer, the term of this patent is extended or adjusted under 35 U.S.C. 154(b) by 645 days.

(21) Appl. No.: 10/606,623

(22) Filed: Jun. 25, 2003

(65) Prior Publication Data

US 2004/0125967 A1 Jul. 1, 2004

(51) Int. Cl.

*H04R 5/00* (2006.01)
*H04R 5/02* (2006.01)
*H04B 1/00* (2006.01)
*H03G 5/00* (2006.01)

(52) U.S. Cl. .............................. 381/22; 381/86; 381/17; 381/20; 381/18; 381/19; 381/98; 381/303

(58) Field of Classification Search .................. 381/86, 381/300, 307, 17, 18, 20, 22, 98, 103, 365, 381/16, 19, 303

See application file for complete search history.

(56) References Cited

U.S. PATENT DOCUMENTS 5,594,800 A 1/1997 Gerzon
5,757,927 A * 5/1998 Gerzon et al. ................. 381/20
6,332,026 B1 12/2001 Kuusama et al.
6,349,285 B1 * 2/2002 Liu et al. .................... 704/500

(Continued)

FOREIGN PATENT DOCUMENTS

| | | | |
|---|---|---|---|
| EP | 1 263 263 | A2 | 12/2002 |
| WO | WO 93/18630 | | 9/1993 |
| WO | WO 03/028407 | A2 | 4/2003 |

OTHER PUBLICATIONS ambisonic.net articles, "All Bass Is Covered—Part 1," A Dictatorial Approach to Bass Management in Surround Music Mixing—original published in *Surround Professional*, Oct. 2002, http://www.ambisonic.net/bassmgt1.html, 2 pages.

(Continued)

*Primary Examiner*—Vivian Chin
*Assistant Examiner*—Devona E Faulk
(74) *Attorney, Agent, or Firm*—Brinks Hofer Gilson & Lione

(57) ABSTRACT

Sound processing systems have been developed that create a surround effect without quality degradation experienced by known sound processing systems in non-optimum listening environments. The sound processing systems may include matrix decoding systems that manipulate input signals prior to converting them into a number of output signals so that the output signals are a function of a greater number of input signals. These sound processing systems may also or alternately include a bass management system that from the input signals preserves the low frequency components of the input signals in separate channels. Both the matrix decoding systems and bass management systems may also produce additional signals. Further, the matrix decoding and bass management systems may be implemented separately or jointly in vehicular sound systems.

50 Claims, 17 Drawing Sheets

U.S. PATENT DOCUMENTS

| | | | | |
|---|---|---|---|---|
| 7,035,413 | B1 * | 4/2006 | Waller et al. | 381/17 |
| 2003/0206639 | A1 | 11/2003 | Griesinger | |
| 2004/0114771 | A1 * | 6/2004 | Vaughan et al. | 381/86 |

OTHER PUBLICATIONS

Dicomo, Paul, "All You Need to Know About Bass Management: Setting Up Your Digital Home Theater System for the Best Performance," from *The Speaker Specialist*, Issue 2, Polk Audio, 2003, http://www.polkaudio.com/home/fagad/advice.php?article=bass-manage, 8 pages.

Griesinger, David, "Multichannel matrix surround decoders for two-eared listeners," Lexicon 100 Beaver Street, Waltham, MA 02154, 21 pages.

Kreisel, Ken, "The Logic Behind Bass Management—OBSERVATIONS," Miller & Kreisel Sound Corp., 9351 Deering Ave., Chatsworth, CA 91311, 818-701-7010, http://www.mkprofessional.com/bass_mgmt.htm, 1 page.

* cited by examiner

BASE MANAGEMENT SYSTEMS

RELATED APPLICATIONS

U.S. patent application Ser. No. 10/254,031, filed Sep. 23, 2002, which claims priority based on U.S. Provisional Application No. 60/377,696, filed May 3, 2002, are both incorporated by reference into this document in their entirety.

BACKGROUND OF THE INVENTION

1. Technical Field

The invention generally relates to sound processing systems. More particularly, the invention relates to sound processing systems having multiple outputs.

2. Related Art

Consumer expectations of sound quality in audio or sound systems are increasing. In general, such consumer expectations have increased dramatically over the last decade, and consumers now expect high quality sound systems in a wide variety of listening environments, including vehicles. In addition, the number of potential audio sources has increased. Audio is available from sources such as radio, compact disc (CD), digital video disc (DVD), super audio compact disc (SACD), tape players, and the like. While sound systems have traditionally supported two-channel ("stereo") formats, today many sound systems include surround processing systems that create a perception that sound is coming from all directions around a listener (a "surround effect"). Such surround sound systems may support formats using more than two discrete channels ("multi-channel surround systems"). Creation of the surround effect in a wide variety of listening environments requires consideration of a different set of variables depending on the listening environment.

Surround sound systems generally use three or more loudspeakers (also referred to as "speakers") that reproduce sound from two or more discrete channels to create the surround effect. Successful development of the surround effect involves creating a sense of envelopment and spaciousness. Such a sense of envelopment and spaciousness, while very complex, generally depends on the spatial properties of the background stream of the sound being reproduced. Reflective surfaces aid the sense of envelopment and spaciousness in the listening environment because reflective surfaces redirect impacting sound back towards the listener. The listener may perceive this redirected sound as originating from the reflective surface or surfaces, thus creating the perception that the sound is coming from all around the listener is enhanced.

Many digital sound processing formats support direct encoding and playback of sounds using multi-channel surround processing systems. Some multi-channel surround processing systems have five or more channels, where each channel carries a signal for conversion into sound waves by one or more loudspeakers. Other channels, such as a separate band limited low frequency channel, also may be included. A common multi-channel surround processing format (referred to as a "5.1 system") uses five discrete channels and an additional band limited low frequency channel that generally is reserved for low frequency effects ("LFE"). Recordings made for reproduction by 5.1 systems may be processed with the assumption that the listener is located at the center of an array of loudspeakers that includes three speakers in front of the listener and two speakers located somewhere between and including the sides of the listener and about 45 degrees behind the listener. In five channel multi-channel surround systems, both the channels and the signals carried by the channels may be referred to as left-front ("LF"), center ("CTR"), and right-front ("RF"), left-surround ("LSur"), and right-surround ("RSur"). When seven channels are implemented, LSur and RSur may be replaced by left-side ("LS"), right-side ("RS"), left-rear ("LR") and right-rear ("RR").

Most recorded material is provided in traditional two-channel stereo. However, a surround effect can be achieved from two-channel signals through the use of matrix decoders. Matrix decoders may synthesize four or more output signals or outputs from two input signals, which may include a left input signal and a right input signal. When used in this manner, matrix decoders mathematically describe or represent various combinations of input signals in an N×2 or other matrix, where N is the number of desired outputs. In a similar manner, matrix decoders may also be used to synthesize additional output signals from three or more discrete input signals using an N×M matrix, where M is the number of discrete input channels.

When used to create a surround effect from a two-channel signal, a matrix usually includes 2N matrix coefficients that define the proportion of the left and/or right input signals for a particular output signal. The values of the matrix coefficients generally depend, in part, on the intended direction of the recorded material as indicated by one or more steering angles. Each steering angle may be a function of two signals. In general, one steering angle is a function of the left and right input signals (the "left/right steering angle" or "lr"), and another steering angle is a function of two signals derived from the right and left input signals (the "center/surround steering angle" or "cs"). Each steering angle indicates the intended direction of the recorded material in terms of an angle between the two signals from which it was derived.

The design of audio or sound systems involves the consideration of many different factors, including for example, the position and number of speakers and the frequency response of each speaker. The frequency response of most speakers traditionally has been limited such that many speakers cannot reproduce low frequencies accurately, if at all. Therefore, most surround processing systems also include a separate speaker or speakers designed and dedicated to producing these low frequency signals. To direct the low frequency signals to this separate low frequency speaker, surround sound systems may employ a process known as "bass management." Traditional bass management separates the low frequencies from each channel using a crossover filter and adds them together to create a single channel ("mono") signal. This procedure may lead to degradation of the surround effect because the combined low frequencies are not decorrelated. Unfortunately, foregoing the traditional bass management may also lead to undesirable results because the low frequencies sound quite unnatural when steered by most matrix decoders.

In another example, the physical properties of a listening environment and/or the manner in which a listening environment will be used dictate the factors that need to be considered when designing sound systems. Most surround sound systems are designed for optimum listening environments. Optimum listening environments generally are reverberant and center the listener among an array of speakers, facing forward in a position known as the "sweet spot." However, the physical properties of non-optimum listening environments can be much different and generally require that different factors be considered when sound systems are designed. One example includes, listening environments that are enjoyed simultaneously by more than one listener, none of whom may be stationary or located in the "sweet spot." Another example includes, listening environments that are quite small and are not very reflective. Such listening environments present a challenge in creating the surround effect. In yet a further example, the listening environment may be such that the listener or listeners are located near one or more of the speakers. Most surround sound systems were simply not designed with these factors in mind.

A vehicle is an example of a non-optimum listening environment in which listener placement, speaker placement and lack of reflectivity are important factors in the design of surround sound systems for that listening environment. A vehicle may be more confined than rooms containing home theatre systems and much less reflective. In addition, the speakers may be in relatively close proximity to the listeners and there may be less freedom with regard to speaker placement in relation to the listener. In fact, it may be nearly impossible to place each speaker the same distance from any of the listeners. For example, in an automobile, the front and rear seating positions and their close proximity to the doors, as well as the size and location of kick-panels, the dash, pillars, and other interior vehicle surfaces that could contain the speakers all serve to limit speaker placement. In another example, when the center speaker is placed in the dash, the size of the center speaker is limited due to the space constraints within the dash. These placement and size restrictions are problematic considering the short distances available in an automobile for sound to disperse before reaching the listeners or the walls. Due to these factors, multi-channel surround processing systems suffer serious quality degradation when implemented in non-optimum listening environments.

SUMMARY

Sound processing systems have been developed that create a surround effect without the quality degradation experienced by known sound processing systems in non-optimum listening environments. These sound processing systems may include a matrix decoding system and/or a bass management system. The matrix decoding system and the bass management system enhance the surround effect in a complimentary manner. The sound processing system may also include a signal source that may provide one or more digital signals to the matrix decoding system and/or the bass management system, a post-processing module, and one or more electronic-to-sound wave transformers for converting one or more output signals into sound waves. The matrix decoding system and the bass management system may be implemented in a sound processing system as part of a surround processing system. The surround processing systems may also include an adjustment module that may further adapt the system to a particular listening environment.

The matrix decoding systems may include a multi-channel matrix decoding method that manipulates input signals and converts them into a number of output signals to create a surround effect even in non-optimum listening environments. The matrix decoding methods may include creating input signal pairs as a function of the various input signals, and creating output signals as a function of the input signal pairs using matrix decoding techniques. The input signal pairs enable the combination of input signals included in the output signals to be adjusted without altering the matrix decoding techniques. In this manner, the rear output signals created by the matrix decoding techniques may be a function of all the input signals. As a result, some sound will emanate from the rear of the listening environment whenever there is an input signal, thus enhancing the surround effect in listening environments that may lack adequate reverberation. The multi-channel matrix decoding methods may provide further enhancement of the surround effect by applying a delay to some of the output signals. In addition, the multi-channel matrix decoding methods may produce additional output signals.

The matrix decoding systems may include a matrix decoding module that manipulates the input signals and converts them into a number of output signals. The input signals may be manipulated by an input mixer, which creates input signal pairs as a function of the input signals. The input signal pairs may then be decoded into an equal or greater number of output signals using a matrix decoder. The matrix decoder may also include one or more shelving filters that may attenuate higher frequencies in certain output signals. These shelving filters may be adaptive as a function of the direction of the sound as indicated by a steering angle. Additionally, the matrix decoder may include one or more delay modules that apply a delay to one or more of the output signals. Further, the matrix decoder may include an additional output mixer that produces additional output signals.

Bass management systems generally create high frequency input signals for processing by a matrix decoder while preserving the low frequency components of the input signals in separate channels. By preserving the low frequency components of the input signals in separate channels, the surround effect created from the input signals may be enhanced. In addition, the unnatural effects that may result from steered low frequency signals may be avoided by preventing the low frequency input signals from being processed by a matrix decoder.

The bass management systems may include a bass management method that removes the low frequency component of the input signals to create high frequency input signals and, removes the low frequency components of the input signals to create high frequency input signals. The high frequency input signals may then be processed by a matrix decoding technique, while the low frequency input signals may forego such processing. In addition, the bass management method may also include creating a separate low frequency or "SUB" signal and may include creating additional low frequency input signals. Further, the bass management method may also include blending one or more of the low frequency input signals into one or more of the other low frequency input signals. This provides low frequency signals, for which there is no full-range speaker, an alternate path for reproduction. In addition, the bass management methods may include combining the low frequency input signals with the high frequency input signals after they have been processed by a matrix decoding technique.

The bass management systems may include bass management modules. These bass management modules may include a low pass filter and a high pass filter for creating the high frequency input signals and the low frequency input signals, respectively. The bass management modules may further include a summation device for creating a SUB signal as a combination of all the input signals. Alternately, the SUB signal may be defined by a LFE signal. The bass management modules may further include additional summation devices for creating additional low frequency input signals. The bass management modules may further include summation devices and may include a gain device for blending one or more of the low frequency input signals into one or more of the other low frequency input signals. In addition, the bass management module may be used in conjunction with a mixer, which recombines the low frequency input signals with the high frequency input. signals after they have been processed by a matrix decoder module.

The matrix decoding systems and/or the bass management systems may be implemented in sound processing systems designed for specific non-optimum listening environments. One example includes vehicular listening environments. These "vehicular sound systems" may include a signal source, a surround processing system, a post-processing module, and a plurality of speakers located throughout a vehicle. The components of the vehicular sound systems may be adapted for a specific vehicle or type of vehicle so that the surround effect is enhanced throughout the vehicle. The surround processing system may include a matrix decoding module, a bass management module, a mixer, or a combination. The vehicular sound systems may also be implemented in larger vehicles. In such an implementation, the vehicular sound systems may include additional speakers, such as: additional center and side speakers that reproduce additional center and side output signals, respectively, produced by the surround processing system.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention.

DETAILED DESCRIPTION OF THE PREFERRED EMBODIMENTS

Figure 1:
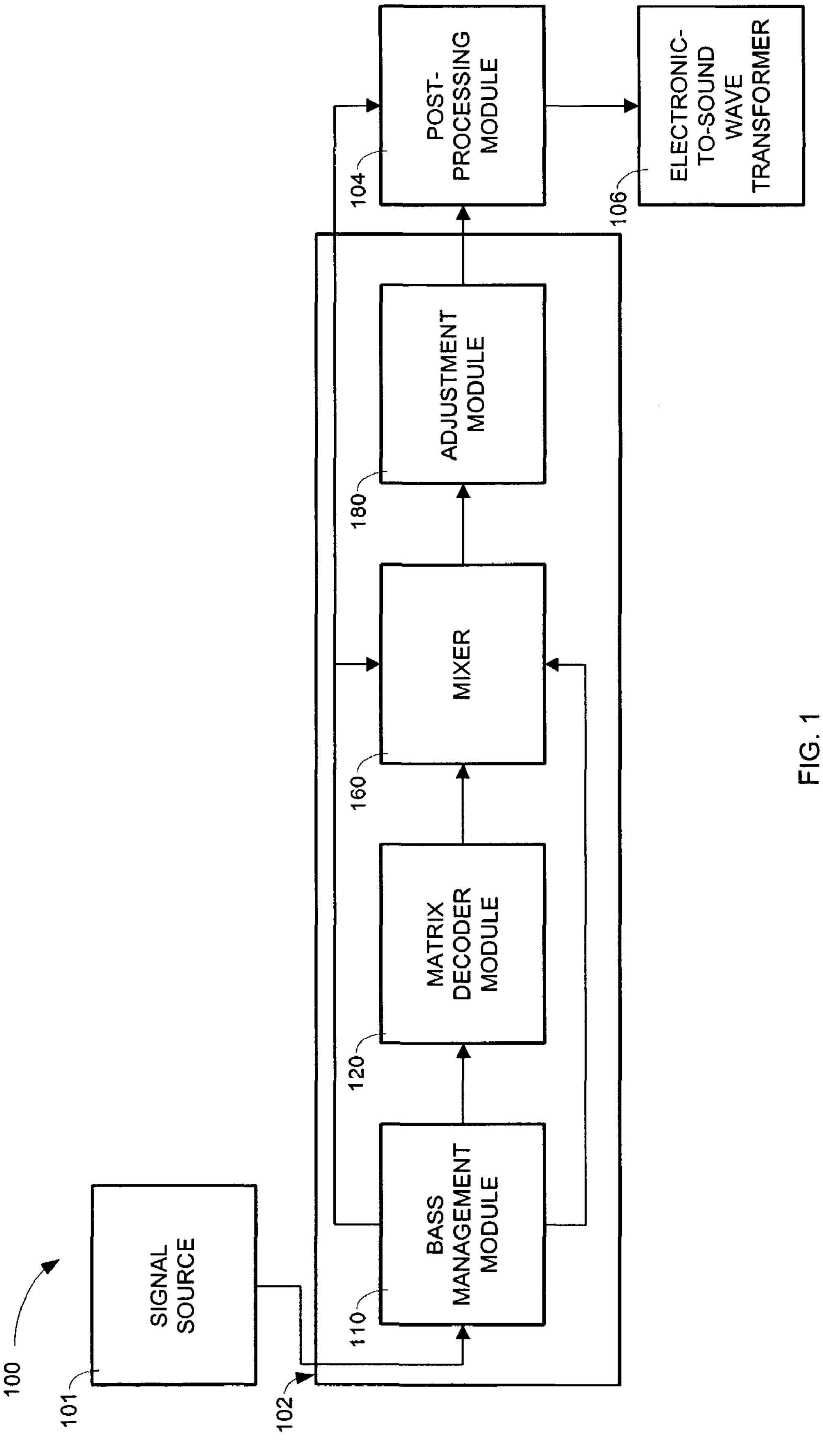
FIG. 1 is a block diagram of a sound processing system.

An example of a sound processing system 100 is shown in FIG. 1. The sound processing system 100 may include a signal source 101, a surround processing system 102, a post-processing module 104 and an electronic-to-sound wave transformer 106. The surround processing system 102 may include a bass management module 110, a matrix decoder module 120, a mixer 150, and an adjustment module 180. While a particular configuration is shown, other configurations may be used including those with fewer or additional components. For example, the surround processing system 102 may not include the bass management module 110 and/or the mixer 160.

In the sound processing system 100, a signal source 101 provides a digital signal to the bass management module 110. Alternatively, the signal source 101 may provide portions of the digital signal directly to the matrix decoder module 120 and other portions to the post-processing module 104 and perhaps to the mixer 160. The signal source 101 may produce the digital signal from one or more signal sources such as radio, CD, DVD and the like, some of which obtain one or more signals from one or more source materials. These source materials may include any digitally encoded material, such as DOLBY DIGITAL AC3®, DTS® and the like, or originally analog material, such as encoded tracks, that are converted into the digital domain. The digital signal produced by the signal source 101 may include one or more signals included in one or more channels (each an "input signal"). The signal source 101 may produce input signals from any 2-channel (stereo) source material such as direct left and right to produce a left-front input signal ("LFI") and a right-front input signal ("RFI"). The signal source 101 also may produce input signals from 5.1 channel source material, to produce a left-front input signal ("LFI"), a right-front input signal ("RFI"), a center input signal ("CTRI"), a left-surround input signal ("LSurI"), a right-surround input signal ("RSurI") and an LFE signal.

The bass management module 110 may be coupled to the signal source 101 from which it receives the input signals. In this document, "coupled to" generally refers to any type of electrical, electronic or electromagnetic connection through which signals may be communicated. In general, the bass management module 110 creates high frequency input signals for input into the matrix decoder module 120 and low frequency input signals for bypassing the matrix decoder that remain in separate channels. For example, if the bass management module 110 receives a 2-channel input signal, it will produce a left-front high frequency input signal ("$LFI_H$"), a right-front high frequency input signal ("$RFI_H$"), a left-front low frequency input signal ("$LFI_L$"), and a right-front low frequency input signal ("$RFI_L$"). In another example, if the bass management module 110 receives 5.1 discrete input signals, in addition to producing $LFI_H$, $RFI_H$, $LFI_L$, and $RFI_L$, it will produce a high frequency center input signal ("$CTRI_H$"), a high frequency left-surround input signal ("$LSurI_H$"), a high frequency right-surround input signal ("$RSurI_H$"), a low frequency center input signal ("$CTRI_L$"), a low frequency left-surround input signal ("$LSurI_L$"), and a low frequency right-surround input signal ("$RSurI_L$"). The low frequency input signals may be coupled to the mixer 160 and/or to the post-processing module 104. Additionally, the bass management module 110 may create an additional low frequency signal ("SUB") that may be coupled to the post-processing module 104.

The matrix decoder module 120 generally converts a number of input signals into a greater or equal number of output signals in a greater or equal number of channels, respectively. The matrix decoder module 120 may be coupled to the signal source 101 from which it receives the input signals and creates a greater or equal number of output signals containing about the full frequency spectrum of the input signals ("full-spectrum output signals"). For example, if the matrix decoder module 120 includes an N×7 matrix decoder and is coupled to a signal source 101 from which it receives LFI and RFI (and may additionally receive CTRI, LSurI, and RSurI), the matrix decoder module 120 will produce seven full-spectrum output signals, including: a left-front output signal ("LFO"), a right-front output signal ("RFO"), a center output signal ("CTRO"), a left-side output signal ("LSO"), a right-side output signal ("RSO"), a left-rear output signal ("LRO"), and a right-rear output signal ("RRO"). In another example, if the matrix decoder is an N×11 matrix decoder and is coupled to a signal source 101 from which it receives LFI and RFI (and may additionally receive CTRI, LSurI, and RSurI), in addition to the output signals mentioned above, it may further produce a second center output signal ("CTRO 2"), a third center output signal ("CTRO3"), a second left-side output signal ("LSO2"), and a second right-side output signal ("RSO2").

Alternatively, the matrix decoder module 120 may be coupled to the bass management module 110 from which it receives the high frequency input signals and creates a greater or equal number of high frequency output signal. For example, if the matrix decoder module 120 includes a N×7 matrix decoder and is coupled to a bass management module 110 from which it receives $LFI_H$ and $RFI_H$ (and may additionally receive $CTRI_H$, $LSurI_H$, and $RSurI_H$), the matrix decoder module 120 will produce seven high frequency output signals, including: a high frequency left-front output signal ("$LFO_H$"), a high frequency right-front output signal ("$RFO_H$"), a high frequency center output signal ("$CTRO_H$"), a high frequency left-side output signal ("$LSO_H$"), a high frequency right-side output signal ("$RSO_H$"), a high frequency left-rear output signal ("$LRO_H$"), and a high frequency right-rear output signal ("$RRO_H$"). In another example, if the matrix decoder includes an N×11 matrix decoder and is coupled to a signal source 101 from which it receives LFI and RFI (and may additionally receive CTRI, LSurI, and RSurI), in addition to the output signals mentioned above, it may further produce a second high frequency center output signal ("$CTRO2_H$"), a third high frequency center output signal ("$CTRO3_H$"), a second high frequency left-side output signal ("$LSO2_H$"), and a second high frequency right-side output signal ("$RSO2_H$").

If the matrix decoder module 120 creates high frequency output signals, these high frequency output signals may be received by the mixer 160. The mixer 160, which may also be coupled to the bass management module 110 from which it receives the low frequency input signals and the SUB signal, combines the high frequency output signals with the low frequency input signals and, in some cases, the SUB signal to produce a full-spectrum output signal for each channel. The mixer 160 may alternatively be implemented as part of the bass management module 110.

The input of the adjustment module 180 may be coupled to the mixer 160, the matrix decoder module 120 (if the mixer 160 is not included), or the matrix decoder module 120 and the bass management module 110 (if the mixer 160 is not included). When coupled to the mixer 160, the adjustment module 180 receives full-spectrum output signals. When coupled directly to the matrix decoder module 120, the adjustment module 180 receives either high frequency or full-spectrum output signals. When coupled to the matrix decoder module 120 and the bass management module 110, the adjustment module 180 receives the high frequency output signals from the matrix decoder module 120 and the low frequency input signals from the bass management module 110. The adjustment module 180 may adjust or "tune" particular characteristics of the signals it receives to create output signals adjusted for a particular listening environment (the "adjusted output signals"). Additionally, the adjustment module 180 may create additional adjusted output signals in additional channels.

The post-processing module 104 may receive the adjusted output signals from the adjustment module 180 and the SUB signal from either the bass management module 110 or the signal source 101. The post-processing module 104 generally prepares the signals it receives for conversion into sound waves and may include one or more amplifiers and one or more digital-to-analog converters. The electronic-to-sound wave transformer 106 may receive signals directly from the post-processing module or indirectly through other devices or modules such as crossover filters (not shown). The electronic-to-sound wave converter 106 generally includes speakers, headphones or other devices that convert electronic signals into sound waves. When speakers are used, at least one speaker may be provided for each channel, where each speaker may include one or more speaker drivers such as a tweeter and a woofer.

Implementations or configurations of the surround processing system, including bass management modules 110, matrix decoders 120, mixers 160, adjustment modules 180, base management methods, matrix decoding methods, vehicular multi-channel surround processing systems, and combinations, each include or may be implemented using computer readable software code. These methods, modules, mixers and systems may be implemented together or independently. Such code may be stored on a processor, a memory device or on any other computer readable storage medium. Alternatively, the software code may be encoded in a computer readable electronic or optical signal. The code may be object code or any other code describing or controlling the functionality described in this document. The computer readable storage medium may be a magnetic storage disk such as a floppy disk, an optical disk such as a CD-ROM, semiconductor memory or any other physical object storing program code or associated data.

1. Bass Management Systems:

The bass management module 110 generally creates high frequency input signals for processing by a matrix decoder while preserving the low frequency components of the input signals in separate channels. By preserving the low frequency components of the input signals in separate channels, the surround effect created from the input signals will be enhanced. In addition, the unnatural effects that may result from steered low frequency signals may be avoided by preventing the low frequency input signals from being processed by a matrix decoder. The bass management module 110 may be used in conjunction with a mixer 160, which recombines the low frequency input signals with the high frequency input signals that have been processed by a matrix decoder module 120 (the "high frequency output signals"). This enables the low and high frequency components of each channel to be jointly processed by an adjustment module 180 and post-processing module 104. However, if the low frequency and high frequency components of the signals in each channel are to be reproduced by separate electronic-to-sound wave transformers 106, such as woofers and tweeters, respectively, the signals in each channel will again need to be separated into low and high frequency components. This separation may be accomplished using a device, such as a crossover filter, for each channel. This device may be coupled between the post-processing module 104 and the electronic-to-sound wave converters 106. Alternatively, the bass management module 110 may be used without a mixer 160. When used without a mixer, the low frequency input signals produced by the bass management module 110, along with the high frequency output signals produced by the matrix decoder module 120, may each be separately coupled to and processed by an adjustment module 180 and subsequently the post-processing module 104. From the post-processing module 104 the low frequency input signal and the high frequency output signals may be separately coupled to one or more electronic-to-sound wave transformers 106, thus eliminating the need to again separate the low and high frequency components of the input signals in each channel.

Figure 2:
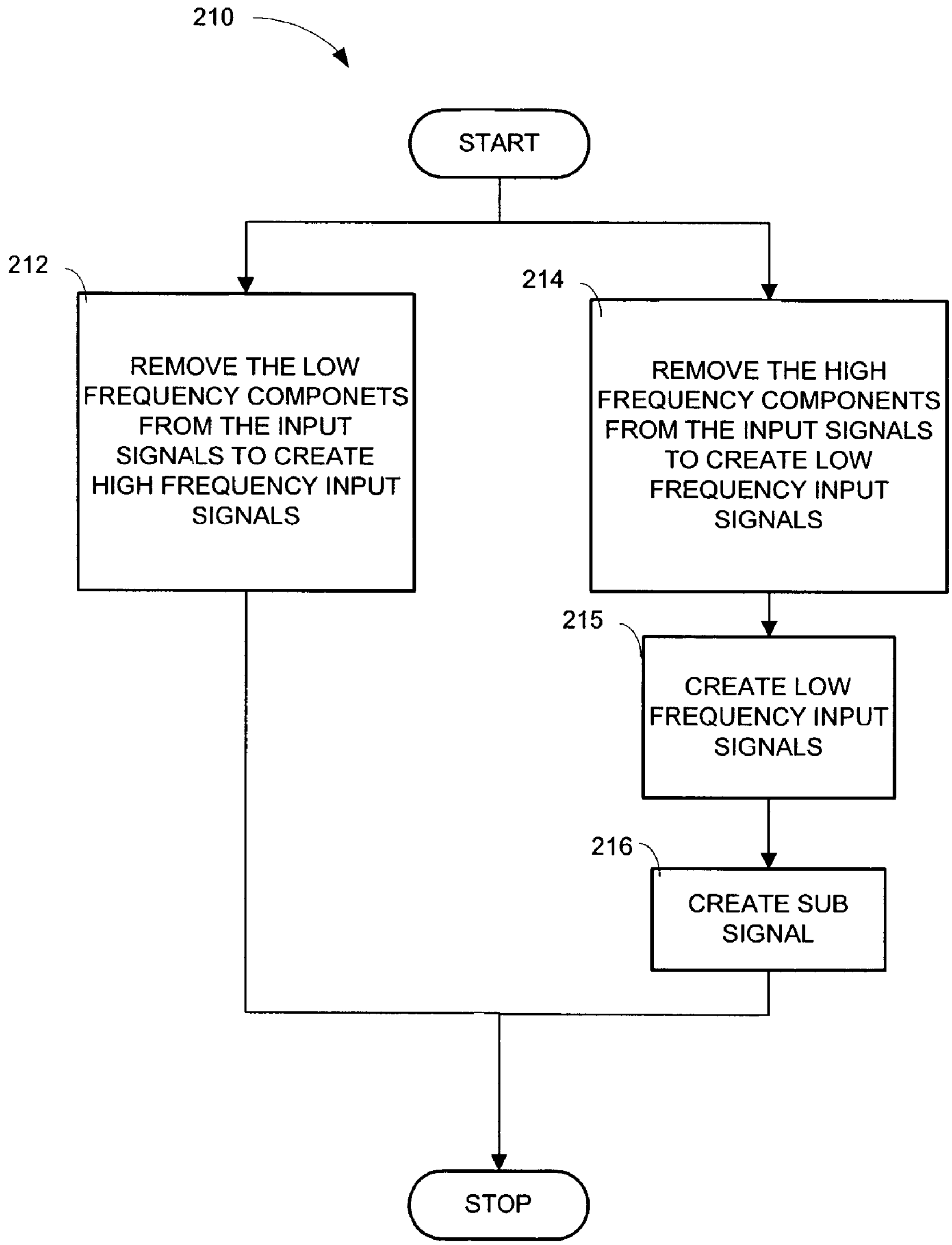
FIG. 2 is a flow chart of a bass management method.

One example of a method by which the low and high frequency input channels may be created (a "bass management method") is shown in FIG. 2. While a particular configuration is shown, other configurations may be used including those with fewer or additional steps. This bass management method 210 generally includes: removing the low frequency component from the input signal to create high frequency input signals 212, removing the high frequency component from the input signals to create initial low frequency input signals 214, creating low frequency input signals 215, and creating a SUB signal 216. Additionally, if the input signals include any surround signals, the bass management method 210, may include creating low frequency side input signals. The bass management method may further include combining the low frequency input signals and, in some cases, the SUB signal with the high frequency input signals after the high frequency input signals have been processed by a matrix decoder (the high frequency output signals).

Removing the low frequency component from the input signals 212 may include removing the frequencies about below a crossover frequency ("$f_c$"). $f_c$ may be about 20 Hz to about 1000 Hz. Removing the low frequency component of the input signals 212 generally results in input signals that include only a high frequency component (frequencies above about 20 Hz to above about 1000 Hz). Removing the high frequency component from the input signals 214 generally includes removing the frequencies about above the crossover frequency $f_c$, to produce initial low frequency components For example, if the input signals were received from a signal source (see FIG. 1, reference number 101) that produces 5.1 input signals, removing the frequencies about above $f_c$ would produce a left-front initial low frequency input signal ("$LFI_L'$"), a right-front initial low frequency input signal ("$RFI_L'$"), a center initial low frequency input signal ("$CRII_L'$"), a left-surround initial low frequency input signal ("$LSurI_L'$"), and a right-surround initial low frequency input signal ("$RSurI_L'$"). Removing the high frequency component of the input signals 214 generally results in input signals that include only the low frequency component (frequencies below about 20 Hz to below about 1000 Hz). Creating the SUB signal 216 may include combining the low frequency input signals, combining the low frequency input signals and an LFE signal or simply using the LFE signal.

Creating low frequency input signals 215 may include defining the initial low frequency signals as the low frequency input signals, creating additional low frequency input signals, blending any undesired initial low frequency input signals into other initial low frequency input signals, or a combination. For example, the input signals may simply be defined by the initial input signals. In some cases, however, additional low frequency input signals may be created so that there is a low frequency input signal for every high frequency output signal created by a matrix decoder. For example, if the input signals include any surround signals, such as LSurI and/or RSurI, additional low frequency input signals, such as low frequency side input signals, may be created. These low frequency side input signals may be created as a combination, such as a linear combination, of some of the low frequency input signals. For example, if the input signals were received from a signal source (see FIG. 1, reference number 101) that produces 5.1 input signals, the left-front, right-front, center, left-surround, and right-surround initial input signals may be used to define the left-front, right-front, center, left-rear, and right-rear input signals, respectively (so that $LFI_L=LFI_L'$, $RFI_L=RFI_L'$, $CTRI_L=CTRI_L'$, $LRI_L=LSurI_L'$, and $RRI_L=RSurI_L'$). In addition, a low frequency left-side input signal ("$LSI_L$") and a low frequency right-side signal ("$RSI_L$") may, respectively, be defined according to the following equations:

$$LSI_L=0.7\ CTRI_L+LFI_L+LSurI_L' \tag{1}$$

$$RSI_L=0.7\ CTRI_L+RFI_L+RSurI_L' \tag{2}$$

In a similar manner, additional low frequency side input signals may be created. In some larger non-optimum listening environments, it may be desirable to include additional center and side output signals. These additional low frequency signals may include an additional left-side and right-side output signal $LSI2_L$ and $RSI2_L$, respectively. $LSI2_L$ may be produced according to equation (1), however, multiplication factors may be included with $LFI_L$ and $LSurI_L'$ to alter the dependence on $LFI_L$ and $LSurI_L'$. Similarly, $RSI2_L$ may be produced according to equation (2), however, multiplication factors may be included with $RFI_L$ and $RSurI_L'$ to alter the dependence on $RFI_L$ and $RSurI_L'$. As the listening environment becomes larger, it may be desirable to include more than one additional left-side and right-side low frequency input signals. The second and higher additional left-side outputs may be may be produced according to equation (1), however, multiplication factors may be included with $LFI_L$ and $LSurI_L'$ to alter the dependence on $LFI_L$ and $LSurI_L'$, so that there is an increasingly heavier dependence on $LSurI_L'$. The second and higher additional left-side outputs may be may be produced according to equation (2), however, multiplication factors may be included with $RFI_L$ and $RSurI_L'$ to alter the dependence on $RFI_L$ and $RSurI_L'$, so that there is an increasingly heavier dependence on $RSurI_L'$.

In a further example, one or more of the initial input signals may be blended into one or more of the other initial output signals. This may be advantageous in certain circumstances where the speaker or other electronic-to-sound wave transformer is incapable of reproducing frequencies below the cut-off frequency. By blending the low frequency component of any undesired channel into the other channels, such low frequency component is preserved. In one example, the center initial input signal ($CTRI_L'$) is blended into the left-front and right-front initial input signals ($LFI_L'$and $RFI_L'$, respectively). This situation may arise, for example, in a sound processing system implemented in a vehicle that does not contain a full-range center speaker. Half the power of $CTRI_L'$ may be bended into $LFI_L'$ and half the power of $CTRI_L'$ may be bended into $RFI_L'$. In this case, $LFI_L=LFI_L'+0.7\ CTRI_L'$, $RFI_L=RFI_L'+0.7\ CTRI_L'$, and $CTRI_L=0$.

The bass management method 210 may further include combining the low frequency input signals and the SUB signal with the high-frequency output signals created by a matrix module (see FIG. 1, reference number 120). For example, if the bass management method receives a 2-channel input signal (including, for example, LFI and LRI) from which it creates $LFI_L$ and $RFI_L$, these low frequency input signals may be combined with the high-frequency output signals produced by a 2×7 matrix decoder to create full-spectrum high frequency output signals according to the following equations:

$$LFO=LFO_H+LFI_L \quad (3)$$

$$RFO=RFO_H+RFI_L \quad (4)$$

$$CTRO=CTRO_H+SUB \quad (5)$$

$$LSO=LSO_H+LFI_L \quad (6)$$

$$RSO=RSO_H+RFI_L \quad (7)$$

$$LRO=LRO_H+LFI_L \quad (8)$$

$$RRO=RRO_H+RFI_L \quad (9)$$

In another example, if the bass management method receives a 5.1 discrete input signal (including input signals, such as, LFI, RFI, CTRI, LSurI, and RSurI) from which it creates $LFI_L$, $RFI_L$, $CTRI_L$, $LSI_L$, $RSI_L$, $LRI_L$, and $RRI_L$, these low frequency input signals may be combined with the high frequency output signals produced by a 5×7 matrix decoder to create full-spectrum output signals according to the following equations:

$$LFO=LFO_H+LFI_L \quad (10)$$

$$RFO=RFO_H+RFI_L \quad (11)$$

$$CTRO=CTRO_H+CTRO_L \quad (12)$$

$$LSO=LSO_H+LSI_L \quad (13)$$

$$RSO=RSO_H+RSI_L \quad (14)$$

$$LRO=LRO_H+LRI_L \quad (15)$$

$$RRO=RRO_H+RRI_L \quad (16)$$

In another example, if the bass management method receives a 5.1 discrete input signal (including, input signals such as, LFI, RFI, CTRI, LSurI, RSurI) from which it creates $LFI_L$, $RFI_L$, $CTRI_L$, $LSI_L$, $RSI_L$, $LRI_L$, and $RRI_L$, these low frequency input signals may be combined with the output signals produced by a 5×11 matrix decoder to create full-spectrum output signals according to equations (10) through (16) and additional full-spectrum output signals, including a second center ("CTRI2"), a third center ("CTRO3"), a second left-side ("LSO2"), and a second right-side ("RSO2") output signal according to the following equations:

$$CTRO2=CTRO_H+CTRO_L \quad (17)$$

$$CTRO3=CTRO_H+CTRO_L \quad (18)$$

$$LSO2=LSO2_H+LSI_L \quad (19)$$

$$RSO2=RSO_H+RSI_L \quad (20)$$

This bass management method may be extended to create further additional full-spectrum side and center output signals by adding any additional high frequency side output signals with the corresponding low frequency surround signal.

The bass management method may be implemented in a bass management module, such as that shown in FIG. 1 (reference number 110). The bass management module 110 may include a high frequency filter that removes , the low frequency component from the input signal to create high frequency input signals, and a low frequency filter that removes the high frequency component from the input signals to create initial low frequency input signals. Additionally, the bass management module 110 may define the SUB signal by an LFE signal or may include a summation device for creating a SUB signal. Further, if the input signals include any surround signals, the bass management module 110, may include one or more summation devices for creating low frequency side input signals. The bass management module 110 may also include one or more summation devices for blending one or more undesired initial low frequency input signals into other initial low frequency input signals.

Figure 3:
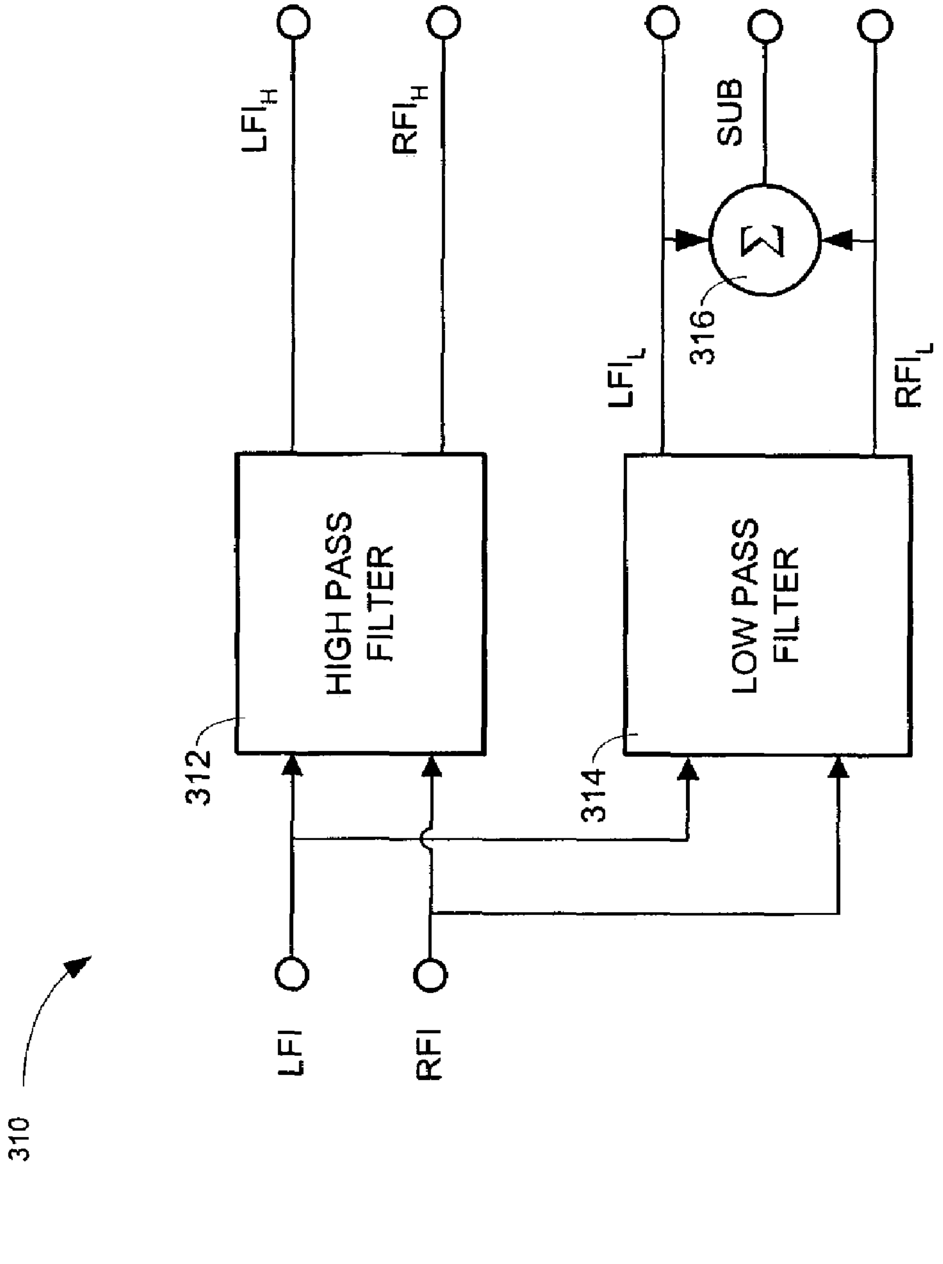
FIG. 3 is a block diagram of a bass management module.

An example of a bass management module that processes two input channels is shown in FIG. 3 and indicated by reference number 310. While a particular configuration is shown, other configurations may be used including those with fewer or additional components. This bass management module 310 may include: a high pass filter 312, a low pass filter 314, and summation device 316. The high pass filter 312 receives the left-front and right-front input signals, LFI and RFI, respectively and removes from each the frequencies below its cutoff frequency or crossover point ("$f_c$") to create high frequency left-front and right-front input signals, $LFI_H$ and $RFI_H$, respectively. The low pass filter 314 also receives the left-front and right-front input signals, LFI and RFI, respectively but removes from each the frequencies above its $f_c$ to create initial low frequency left-front and right-front low frequency input signals, $LFI_L'$ and $RFI_L'$, respectively. In this example, the high frequency left-front and right-front low frequency input signals, $LFI_L$ and $RFI_L$, respectively, are defined as $LFI_L'$ and $RFI_L'$, The high pass filter 312 and low pass filter 314 are generally complimentary in that the frequency response of the sum of their outputs should equal about the input signal. The cutoff frequency or crossover point ("$f_c$") for the high pass filter 312 may equal about that of the low pass filter 314. $f_c$ may equal from about 20 Hz to about 1000 Hz. The high pass filter 312 and low pass filter 314 may be implemented by a single crossover filter that includes a complementary pair of filters such as first order Butterworth filters or lattice filters. The summation device 316 receives $LFI_L$ and $RFI_L$ and adds them together to produce the SUB signal.

Figure 4:
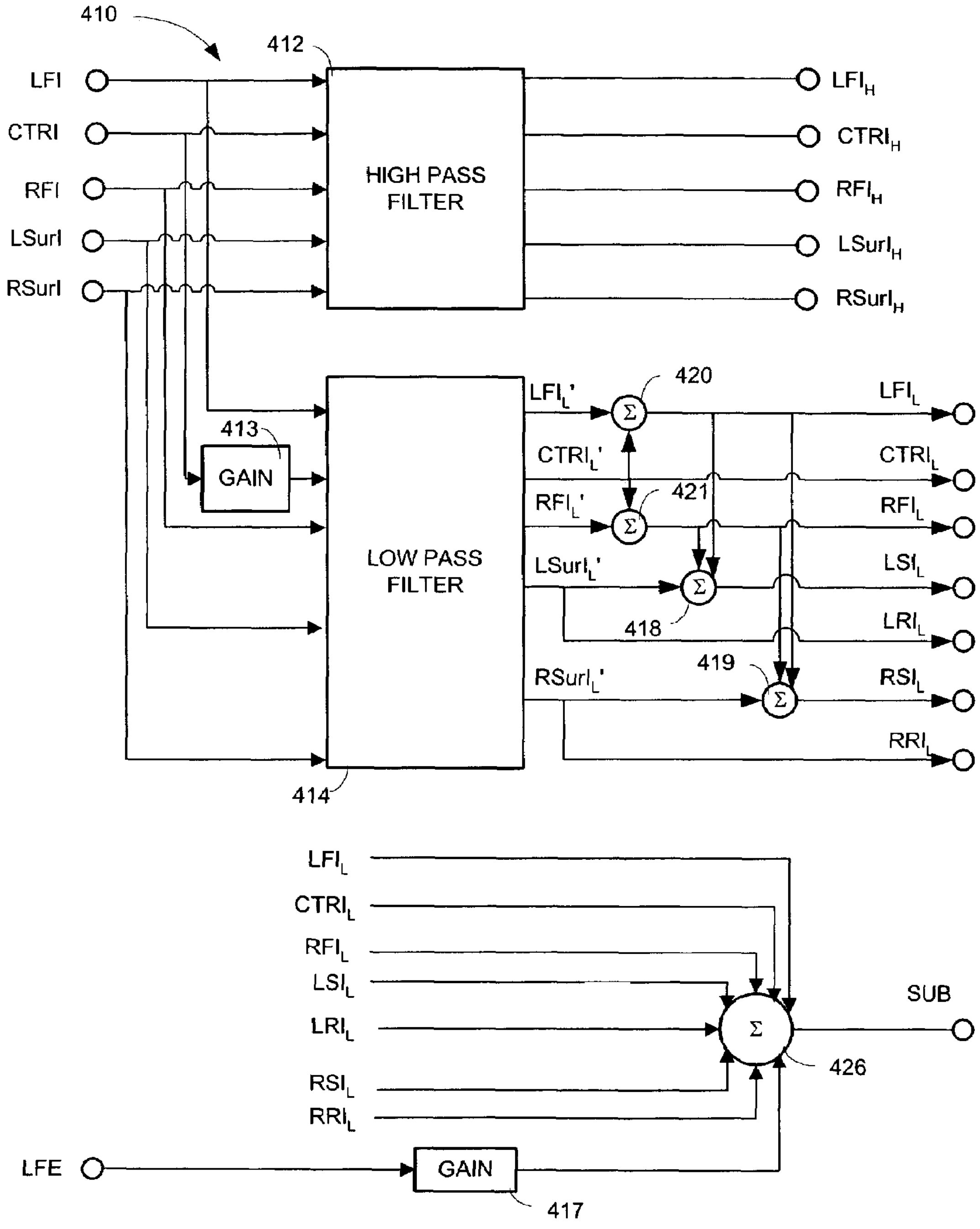
FIG. 4 is a block diagram of another bass management module.

An example of a bass management module that processes 5.1 discrete input channels (which may include LFI, RFI, CTRI, L SurI, and R SurI) is shown in FIG. 4 and indicated by reference number 410. This bass management module 410 may include: a high pass filter 412 and a low pass filter 414. The high pass filter 412 receives the five discrete input signals LFI, RFI, CTRI, LSurI, and RSurI and removes from each the frequencies below its $f_c$ to create high frequency left-front, right-front, center, left-surround, and right-surround input signals $LFI_H$, $RFI_H$, $CTRI_H$, $LSurI_H$, and $RSurI_H$, respectively. The low pass filter 314 also receives the five discrete input signals LFI, RFI, CTRI, LSurI, and RSurI but removes from each the frequencies above its $f_c$ to create initial low frequency left-front, right-front, center, left-surround, and right-surround input signals $LFI_L'$, $RFI_L'$, $CTRI_L'$, $LSurI_L'$, and $RSurI_L'$, respectively. The high pass filter 412 and low pass filter 414 are generally complimentary in that the frequency response of the sum of their outputs should equal about that of the input signal. The $f_c$ for the high pass filter 412 may equal about that of the low pass filter 414. $f_c$ may equal from about 20 Hz to about 1000 Hz. The high pass filter 412 and low pass filter 414 may be implemented by a single crossover filter that includes a complementary pair of filters such as first order Butterworth filters or lattice filters.

The bass management module 410 may also include summation devices 418 and 419 that combine the low frequency input signals to create additional low frequency input signals. These additional low frequency input signals may include a low frequency left-side input signal $LSI_L$ and a low frequency right-side input signal $RSI_L$, which may be created using summation devices 418 and 419, respectively, according to equations (1) and (2). In this example, the low frequency left-rear input signal $LRI_L$ may be defined by the initial low frequency left-surround input signal $LSurI_L'$ and the low frequency right-rear input signal $RRI_L$ may be defined by the initial low frequency left-surround input signal $LSurI_L'$, so that $LRI_L=LSurI_L'$ and $RRI_L=RSurI_L'$, respectively.

The bass management module 410 may also include summation devices 420 and 421 that blends the initial low frequency center input signal $CTRI_L'$ into the initial left-front and right-front low frequency input signals, $LFI_L'$ and $RFI_L'$, respectively. The gain module may further include an amplifier that multiplies $CTRI_L'$ by a constant, such as 0.7 before it is added to $LFI_L'$ and $RFI_L'$. Summation device 421 blends $CTRI_L'$ with $RFI_L'$ and to create $RSI_L$. Similarly, summation device 420 combines $CTRI_L'$ with $LFI_L'$ to create $LSI_L$. In addition, a gain unit 413 may be included to alter CTRI before it is filtered by the low pass filter 414.

The bass management module 410 may also include a summation device 426 that receives the low frequency input signals $LFI_L$, $RFI_L$, $CTRI_L$, $LSurI_L$, $RSurI_L$ and the low frequency effects signal LFE and adds them together to produce the SUB signal. In addition, a gain unit 417 may be included to vary the amount of the LFE signal included in the SUB signal. Alternately, the summation device 426 may be omitted so that the SUB signal will simply equal LFE.

2. Matrix Decoding Systems:

The matrix decoder module 120 shown in FIG. 1 may include any matrix decoding method that converts a number of discrete input signals into a greater or equal number of output signals. For example, the matrix decoder module 120 may include methods for decoding a two-channel input signal into 7 output signals, such as those used by Logic7® or DOLBY PRO LOGIC®. Alternately the matrix decoder module 120 may include a matrix decoding method that decodes discrete multi-channel signals in a manner suitable for non-optimum listening environments (a "multi-channel matrix decoding method"). The matrix decoders and matrix decoding methods may receive full-spectrum input signals or low frequency input signals. In the example description associated with this section (Matrix Decoding Systems) including FIGS. 7 and 8 with regard to matrix decoder modules, matrix decoders and matrix decoding methods, any reference to any input signal, output signal, initial output signal, or combinations will be understood to refer to both full-spectrum and low frequency input and output signals, unless otherwise indicated.

In general, multi-channel matrix decoding methods manipulate the input signals contained in a number of discrete input channels prior to converting them into a greater or equal number of output signals in a greater or equal number of channels, respectively, using matrix decoding techniques. By manipulating the input signals prior to converting them into a number of output signals using matrix decoding techniques, the resulting output signals create a surround effect even in non-optimum listening environments. Additionally, the method is compatible with known matrix decoding techniques and can be implemented without altering the matrix decoding techniques.

Figure 5:
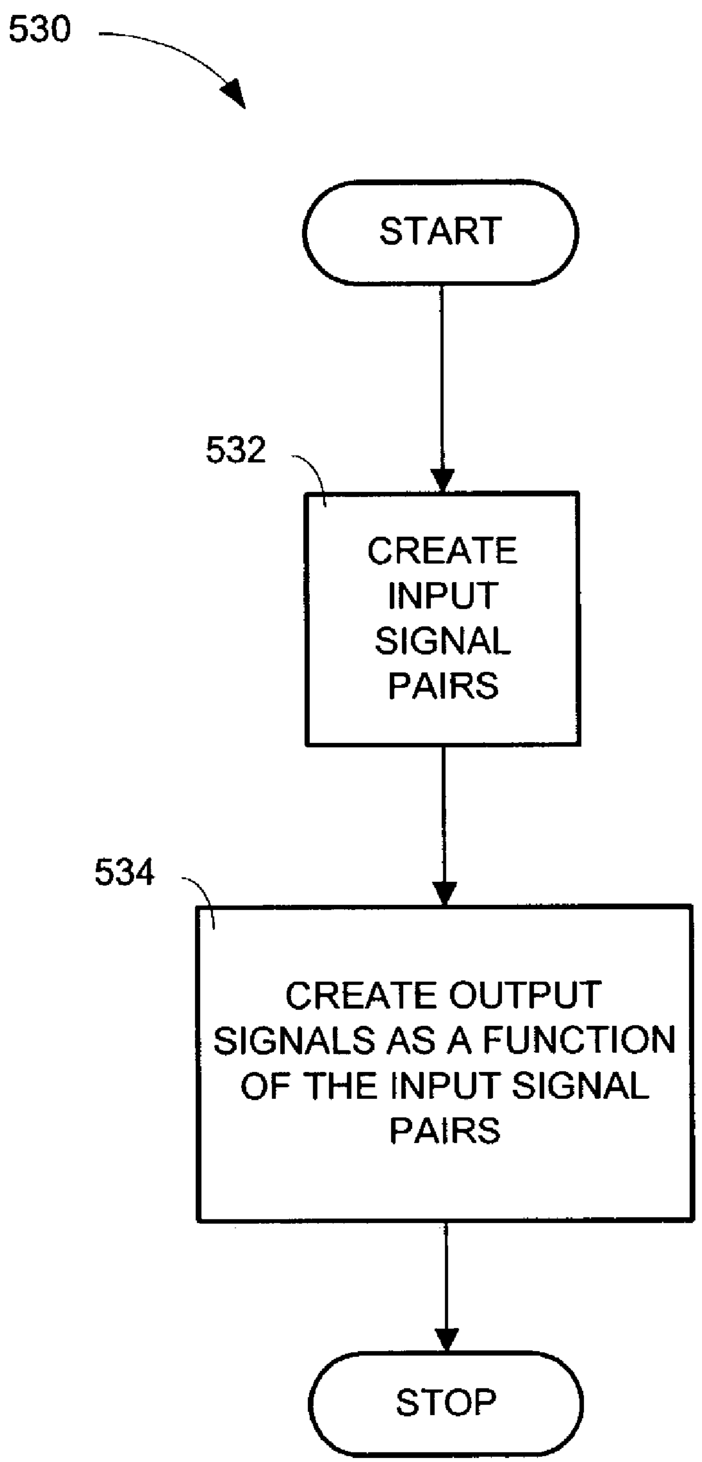
FIG. 5 is a flow chart of a multi-channel matrix decoding method.

An example of a multi-channel matrix decoding method is shown in FIG. 5 and indicated by reference number 530. While a particular configuration is shown, other configurations may be used including those with fewer or additional steps. This multi-channel matrix decoding method 530 generally includes: creating input signal pairs 532, and creating output signals as a function of the input signal pairs 534. Input signal pairs are created 532 as a combination of the various input signals. When used as the input signals for matrix decoding techniques, the input signal pairs enable the output signals to include a different combination of input signals which, if the output signals were defined solely by the matrix, would not have been included. Therefore, the surround effect is enhanced even in non-optimum listening environments. For example, an input signal pair may be created so that the rear output signals resulting from a matrix decoding technique are a function of all the input signals. As a result, some sound will emanate from the rear of the listening environment whenever there is an input signal, which enhances the surround effect in listening environments that lack adequate reverberation. The input signal pairs may be created so that certain input signals or an amount of certain input signals are blended with adjacent input signals to provide a smoother transition between adjacent channels. In addition, the input signal pairs may be a function of one or more tuning parameters, which can be adjusted to control the amount of a certain input signal included in an output signal. The result is a smoother auditory transition between adjacent channels, which helps compensate for non-optimum speaker and listener placement within a listening environment. Furthermore, input signal pairs may also be created so that the output signal is steered based on spatial clues from all the input signals and not just those included in the front input signals.

Input signal pairs may be created for each submatrix used by a matrix decoding technique, where a submatrix is the relationship or set of relationships that convert specific input signals into a set of specific output signals. The relationship or set of relationships may be defined according to a mathematical formula, chart, look-up table, or the like. For example, a 2×7 matrix decoder may include three submatrices. The first submatrix (the "rear submatrix") defines the way in which the input signals are to be combined to create LRO and RRO. The second submatrix (the "side submatrix") defines the way in which the input signals are to be combined to create LSO and RSO and the third submatrix (the "front submatrix") defines the way in which the input signals are to be combined to create LFO, RFO and CTRO. Therefore, for a 2×7 matrix decoder, input signal pairs may be created for each of the three submatrices.

For example, when converting five (5) discrete input signals into seven (7) output channels, the input signal pair for the rear submatrix (the "rear input pair" or "RIP") may be defined according to the following equations:

$$RI1=LFI+0.9LSurI+0.38RSurI+GrCTRI \quad (21)$$

$$RI2=RFI-0.38LSurI-0.91RSurI+GrCTRI \quad (22)$$

where RI1 is the first signal of the rear input pair (the "first rear input signal"), RI2 is the second signal of the rear input pair (the "second rear input signal"), and Gr is a tuning parameter (the "center-to-rear downmix ratio"). Gr controls the amount of the CTRI signal included in the RIP, and therefore, the amount of CTRI included in each of the rear output signals produced by a matrix decoder. Typical values of Gr include about zero and fractional values, such as 0.1. However, any value of Gr may be suitable. Assigning a value to Gr of greater than zero allows CTRI to be heard by listeners that may be located near the rear speakers but at a distance from the center speaker. Therefore, the value of Gr may depend on the listening environment in which the matrix decoding method is implemented. Gr may be determined empirically by reproducing a sound according to the matrix decoding method and adjusting Gr until an aesthetically desirable sound is created in the desired locations.

Additionally, the input signal pair for the side submatrix (the "side input pair" or "SIP") may be defined according to the following equations:

$$SI1=LFI+0.91LSurI+0.38RSurI+GsCTRI \quad (23)$$

$$SI2=RFI-0.38LSurI-0.91RSurI+GsCTRI \quad (24)$$

where SI1 is the first signal of the side input pair (the "first side input signal"), SI2 is the second signal of the side input pair (the "second side input signal"), and Gs is a tuning parameter (the "center-to-side downmix ratio"). Gs controls the amount of the CTRI input signal included in the SIP, and therefore, the amount of CTRI included in each of the side output signals produced by a matrix decoder. Typical values of Gs include about 0.1 to about 0.3, however, any value of Gs may be suitable. Assigning a value to Gs of greater than zero allows CTRI to be heard by listeners that may be located near the side speakers but at a distance from the center speaker and may move the center image of the sound produced by a matrix decoder further to the rear. Therefore, the value of Gs may depend on the listening environment in which the matrix decoding method is implemented. Gs may be determined empirically by reproducing a sound according to the matrix decoding method and adjusting Gs until an aesthetically desirable sound is created in the desired locations.

Further, the input signal pair for the front submatrix (the "front input pair" or "FIP") may be defined according to the following equations:

$$FI1=LFI+0.7CTRI \quad (25)$$

$$FI2=RFI+0.7CTRI \quad (26)$$

where FI1 is first signal of the front input pair (the "first front input signal"), and FI2 is the second signal of the front input pair (the "second front input signal").

In addition, an input signal pair may be created for use by known matrix decoding techniques determining one or more steering angles (the "steering angle input pair" or "SAIP"). In known matrix decoding techniques, one or more steering angles are determined using the left and right input signals. However, when there are more than two input signals, it may be advantageous to "steer" the output signals according to directional changes in all the input signals. Such may be accomplished without altering the method used for determining the steering angle by determining the steering angles from input signal pairs that are a function of all the input signals. For example, when converting five discrete input signals into seven outputs, the steering angle input pair may be defined according to the following equations:

$$SAI1=LFI+0.7CTRI+0.91LSurI+0.38RSurI \quad (27)$$

$$SAI2=RFI+0.7CTRI-0.38LSurI-0.91RSurI \quad (28)$$

where SAI1 is the first signal of the steering angle input pair (the "first steering angle input signal"), and SAI2 is the second signal of the steering angle input pair (the "second steering angle input signal").

Figure 6:
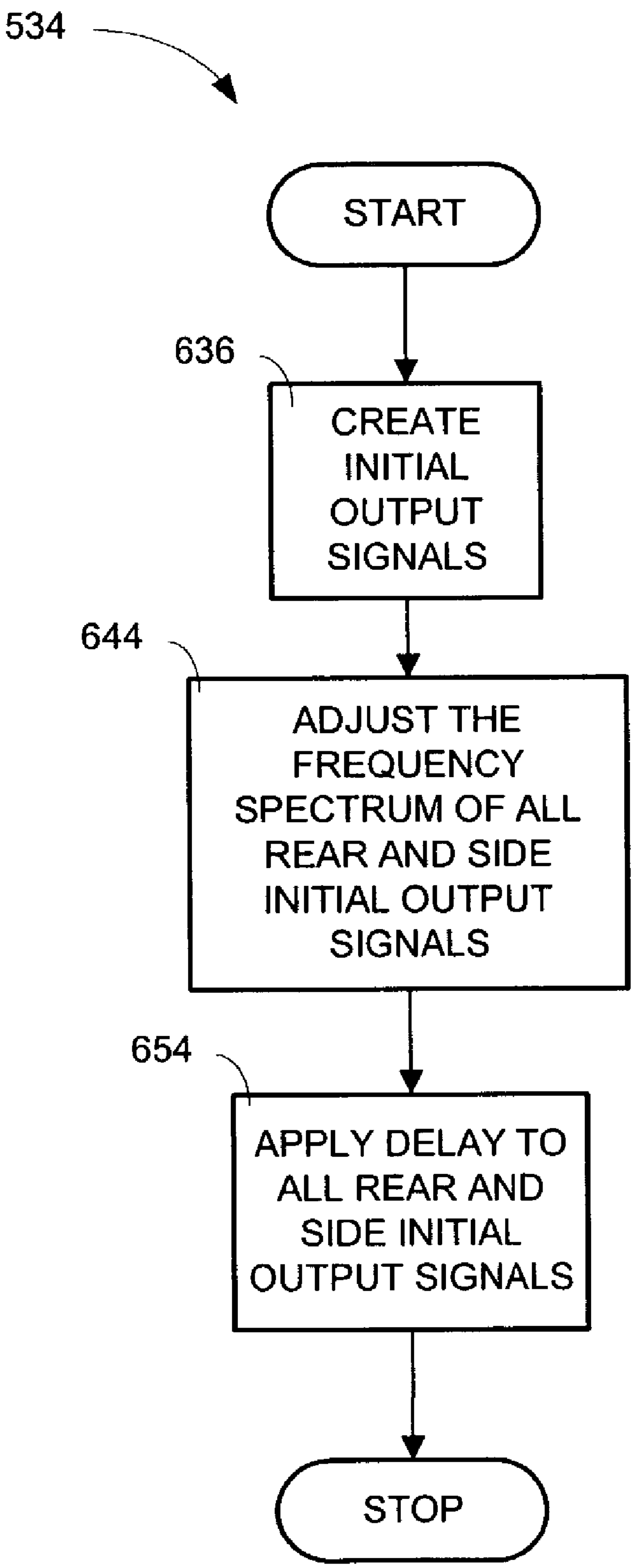
FIG. 6 is a flow chart of a method for creating output signals as a function of input signals pairs.

Once the input signal pairs have been created, they may be used to create initial output signals. A method for creating output signals as a function of the input signal pairs 534 is shown in more detail in FIG. 6 and includes: creating initial output signals 636, adjusting the frequency spectrum of all rear and side initial output signals 644, and applying a delay to all rear and side initial output signals 654. The initial output signals may be created 636 from the input signal pairs using known active matrix decoding techniques, such as those used by LOGIC 7® or DOLBY PRO LOGIC®. Using active matrix decoding techniques, the rear input pair may be decoded into initial rear output signals iRRO and iLRO, the side input pair may be decoded into initial side output signals iRSO and iLSO, and the front input pair may be decoded into initial front output signals iCTRO, iLFO and iRFO, as a function of two steering angles, lr and cs.

The initial rear and side output signals may be further processed to produce the rear and side output signals. Generally, the initial front output signals are not processed further and therefore may equal the front output signals (iCTRO may equal about CTRO, iLFO may equal about LFO, and iRO may equal about RFO). Because the initial rear and side output signals are a function of all the input signals, the rear and side output channels will produce a signal whenever there is a signal in any of the input channels. However, to enhance the surround effect, generally only the background signals (which are generally lower frequency signals) need to be reproduced in the rear and side outputs. In fact, reproducing higher frequency signals in the rear and side outputs when the input signals are steered to the front may be perceived as unnatural motion. Therefore, further processing of the initial rear and side output signals may include adjusting their frequency spectrum 644.

Adjusting the frequency spectrum of the initial rear and side output signals 644 may include attenuating the frequencies above a specified frequency. The specified frequency may be about 500 Hz to a bout 1000 Hz, but any frequency may be suitable. In addition, adjusting the frequency spectrum of the initial rear and side output signals 644 may include attenuating the frequencies above a specified frequency as a function of one or more of the steering angles. For example, the frequency spectrum of the initial rear and side output signals may only be adjusted when cs indicates that the output signal is to be steered solely to the front channels (cs>0 degrees). Alternately, the frequency spectrum of the initial rear and side output signals may be adjusted as a function of cs so that full adjustment occurs when the output signal is to be steered solely to the front channels (c>0 degrees), no adjustment may be made when the output signal is to be steered solely to the rear channels (c=−22.5 degrees), and partial adjustment may be made when the output signals are to be steered somewhere in-between (−22.5<cs<0). This attenuation may be accomplished using one or more adaptive digital filters, such as adaptive bass shelving filters, adaptive lowpass filters or both, which may be adapted as a function of cs.

The additional processing of the initial side and rear output signals may also include filtering either the LRO and LSO signals or the RRO and RSO signals with an all pass filter. Many matrix decoding methods use symmetry to reduce the number of computations required to decode signals. For example, the matrix decoding system may assume that LRO=RRO and LSO=RSO and, therefore, only compute RRO and RSO. However, in some cases, there may actually be a phase difference between LRO and RRO and between LSO and RSO. This phase difference may be added by filtering either the LRO and LSO signals or the RRO and RSO signals with an all pass filter that adds this phase difference. The phase difference may be about 180 degrees. Additionally, the phase difference may be a function of the steering angle cs so that the phase difference is only applied when cs is about less than −22.5 degrees.

In order to help compensate for non-optimum speaker placement, the additional processing of the rear and side output signals may also include applying a delay to these signals 654. The delay may be applied before or after adjusting the frequency response of the rear and side output signals.

A rear delay may be applied to each of the rear output signals and a side delay may be applied to each of the side output signals. The delay applied to the rear output signals may be different than that applied to the side output signals depending on the features or characteristics of the listening environment. The rear delay may have a value of about 8 ms to about 12 ms, however, other values may be suitable. The side delay may have a value of about 16 ms to about 24 ms, however, other values may be suitable. The values for the rear and side delays may be determined empirically by reproducing a sound according to the matrix decoding methods and adjusting the rear and side delay values until a desirable sound is produced.

In some larger non-optimum listening environments, it is desirable to include additional center and side output signals. Therefore, the multi-channel matrix decoding method may further include producing additional output signals. In one example, producing additional output signals includes producing an additional left-side and right-side output signal LSO2 and RSO2, respectively, and at least two additional center output signals CTRO2 and CTRO3 each in an additional output channel. LSO2 may be located about along the side of the listening environment about between LSO1 and LRO and may be produced as a linear combination of LSO and LRO. Similarly, RSO2 may be located about along the side of the listening environment about between RSO1 and RRO and may be produced as a linear combination of RSO and RRO. CTRO2 may be about centrally located about between LSO and RSO and produced using CTRO and may be equal to CTRO. Similarly, CTRO3 may be about centrally located about between LSO2 and RSO3 and produced using CTRO and may be equal to CTRO.

As the listening environment becomes larger, it may be desirable to include more than one additional left-side, right-side and more than two additional center output signals. Any such additional left-side output signals may be added between the left-rear output signals and the left-side output signal closest to the rear output channel. The second and higher additional left-side outputs may be a linear combination of LSO and LRO, but with an increasingly heavier dependence on LRO. Any such additional right-side outputs may be similarly located on the right side and may be a linear combination of RSO and RRO, but with an increasingly heavier dependence on RRO. For example, a second additional left-side output LSO3 may be included along the sides of the listening environment between LSO2 and LRO and produced as a linear combination of LSO and LRO with a heavier dependence on LRO than LSO2. Similarly, second additional right-side output RSO3 may be included along the sides of the listening environment between RSO2 and RRO and be produced as a linear combination of RSO and RRO with a heavier dependence on RRO than RSO2. As each additional left and right side output is added, at least one additional center output may be added as previously described.

The matrix decoding methods may be implemented in a matrix decoder module shown in FIG. 1. The matrix decoder module 120 may include any matrix decoder that converts a number of discrete signals into a greater or equal number of discrete signals in a greater or equal number of channels, respectively. For example, the matrix decoder module 120 may be a 2×5 or 2×7 matrix decoder, such as Logic7® or DOLBY PRO LOGIC®. Alternately, the matrix decoder module 120 may include a matrix decoder that can decode discrete multi-channel signals in a manner suitable for non-optimum listening environments (a "multi-channel matrix decoder"). The multi-channel matrix decoders may manipulate the input signals prior to converting them into a greater or equal number of output signals in a greater or equal number of channels, respectively. By manipulating the input signals, the resulting output signals may be used to create a surround effect even in non-optimum listening environments. Additionally, the multi-channel matrix decoder is compatible with known matrix decoders and can be implemented without altering the matrix decoder itself.

Figure 7:
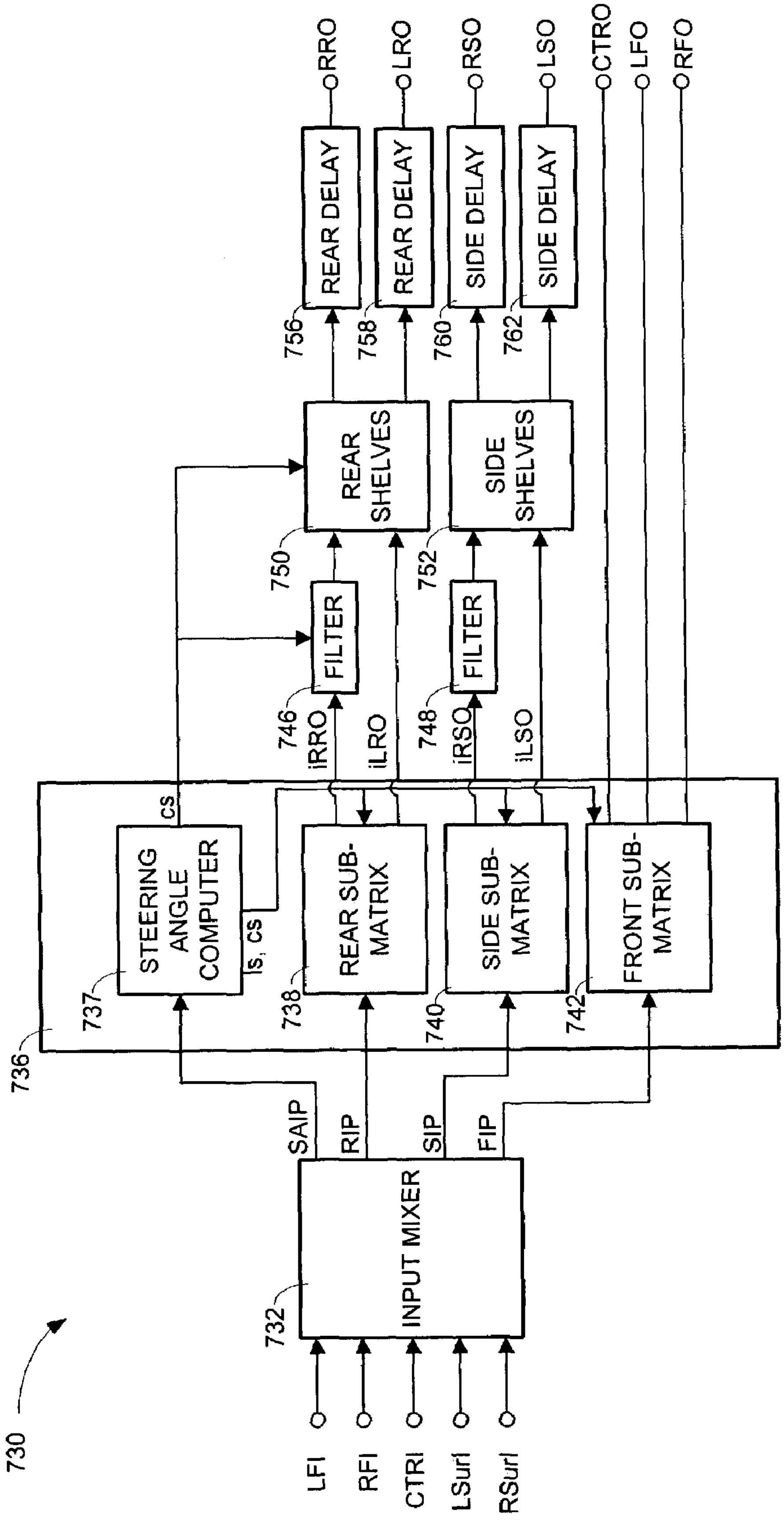
FIG. 7 is a block diagram of a multi-channel matrix decoder module.

An example of a multi-channel matrix decoder is shown in FIG. 7 and indicated by reference number 730. While a particular configuration is shown, other configurations may be used including those with fewer or additional components. The multi-channel matrix decoder 730 may include: an input mixer 572, a matrix decoder 736, filters 746 and 748, rear shelves 750, side shelves 752, rear delay modules 756 and 758, and side delay modules 760 and 762. The input mixer 732 may receive five discrete input signals (which may include LFI, RFI, CTRI, LSurI, and RsurI) and produces four pairs of input signals including, a rear input pair RIP, a side input pair SIP, a front input pair FIP and a steering angle input pair SAIP. The input mixer 732 may create RIP as a linear combination of all input signals LFI, RFI, LSurI, RsurI and CTRI according to equations (21) and (22), SIP as a linear combination of all input signals LFI, RFI, LSurrI, RSurrI and CTRI according to equations (23) and (24), FIP as a linear combination of the front input signals LFI, RFI, and CTRI according to equations (25) and (26), and SAIP as a linear combination of all input signals LFI, RFI, LSurrI, RSurrI and CTRI according to equations (27) and (28).

The matrix decoder 736 may be coupled to the input mixer 732 from which it receives the input signal pairs and creates initial output signals as a function of the input signal pairs. The matrix decoder may include a steering angle computer 737, a rear submatrix 738, a side submatrix 740, and a front submatrix 742. The steering angle computer 737 may use the SAIP to create two steering angles, ls and cs. The steering angle computer 737 may be coupled to the rear, side and front submatrices 738, 740, and 742, respectively, and may communicate ls and cs to the each of the submatrices. The rear submatrix 738 produces the initial rear outputs iRRO and iLFO, the side submatrix 740 produces the initial side outputs iRSO and iLSO and the front submatrix 742 produces the initial front output signals: iCTRO, iLFO and iRFO. The matrix decoder 736 may be a known active matrix decoder such as LOGIC 7®, DOLBY PRO LOGIC®, or the like.

The initial rear and side outputs may be processed further to produce the rear and side output signals. The initial front output signals may not be processed and therefore may equal about the front output signals. Filters 746 and 748 may be coupled to the matrix decoder 736 from which they may receive iRRO and iRSO or iLRO and iLSO. Additionally, filters 746 and 748 may be coupled to the steering angle computer 737 from which they may receive cs. Filters 746 and 748 may be adaptive digital filters such as, adaptive all-pass filters, adaptive low pass filters, or both. Filters 746 and 748 may apply a phase difference to either iRRO and iRSO or iLRO and iLSO. This phase difference may be about 180 degrees. Additionally, the phase difference may be a function of the steering angle cs so that the phase difference is only applied when cs is about less than −22.5 degrees.

The rear and side shelves 750 and 752, respectively, may adjust the frequency spectrum of the rear and side output signals as a function of cs. For example, the rear and side shelves 750 and 752, respectively, may only adjust the frequency spectrum of the rear and side output signals when cs indicates that the output signal is to be steered solely to the front channels (cs>0 degrees). Alternately, the rear and side shelves 750 and 752, respectively, may adjust the frequency spectrum of the rear and side shelves as a function of cs so that full adjustment occurs when the output signal is to be steered solely to the front channels (c>0 degrees), no adjustment may be made when the output signal is to be steered solely to the rear channels (c=−22.5 degrees), and partial adjustment may be made when the output signals are to be steered somewhere in-between (−22.5<cs<0). The rear and side shelves 750 and 752, respectively, may include frequency domain filters such as shelving filters.

A pair of rear delay modules 756 and 758 may be coupled to the rear shelves 750 from which they receive iRRO (filtered or unfiltered) and iLRO (filtered or unfiltered). The rear delay modules 756 and 758 may apply a time delay to iRRO (filtered or unfiltered) and iLRO (filtered or unfiltered), respectively, to produce output signals RRO and LRO respectively. Similarly, a pair of side delay modules 760 and 762 may be coupled to the side shelves 752 from which they may receive iRSO (filtered or unfiltered) and iLSO (filtered or unfiltered). The side delay modules 760 and 762 may apply a time delay to iRSO (filtered or unfiltered) and iLSO (filtered or unfiltered), respectively, to produce output signals RSO and LSO respectively. The delay applied by the rear delay modules 756 and 758 may be different than that applied by side delay modules 760 and 762 depending on the features or characteristics of the listening environment. The rear delay modules 756 and 758 may apply a time delay having a value of about 8 ms to about 12 ms, however, other values may be suitable. The side delay modules 760 and 762 may apply a time delay having a value of about 16 ms to about 24 ms, however, other values may be suitable. The values applied by the rear delay modules 756 and 758 and side delay modules 760 and 762, respectively, may be determined empirically by reproducing a sound according to the matrix decoding methods and adjusting the rear and side delay values until a desirable sound is produced. Alternately, the positions of rear shelves 750 and the rear delay modules 756 and 758 may be reversed. Similarly, the positions of side shelves 752 and the side delay modules 760 and 762 may be reversed.

Figure 8:
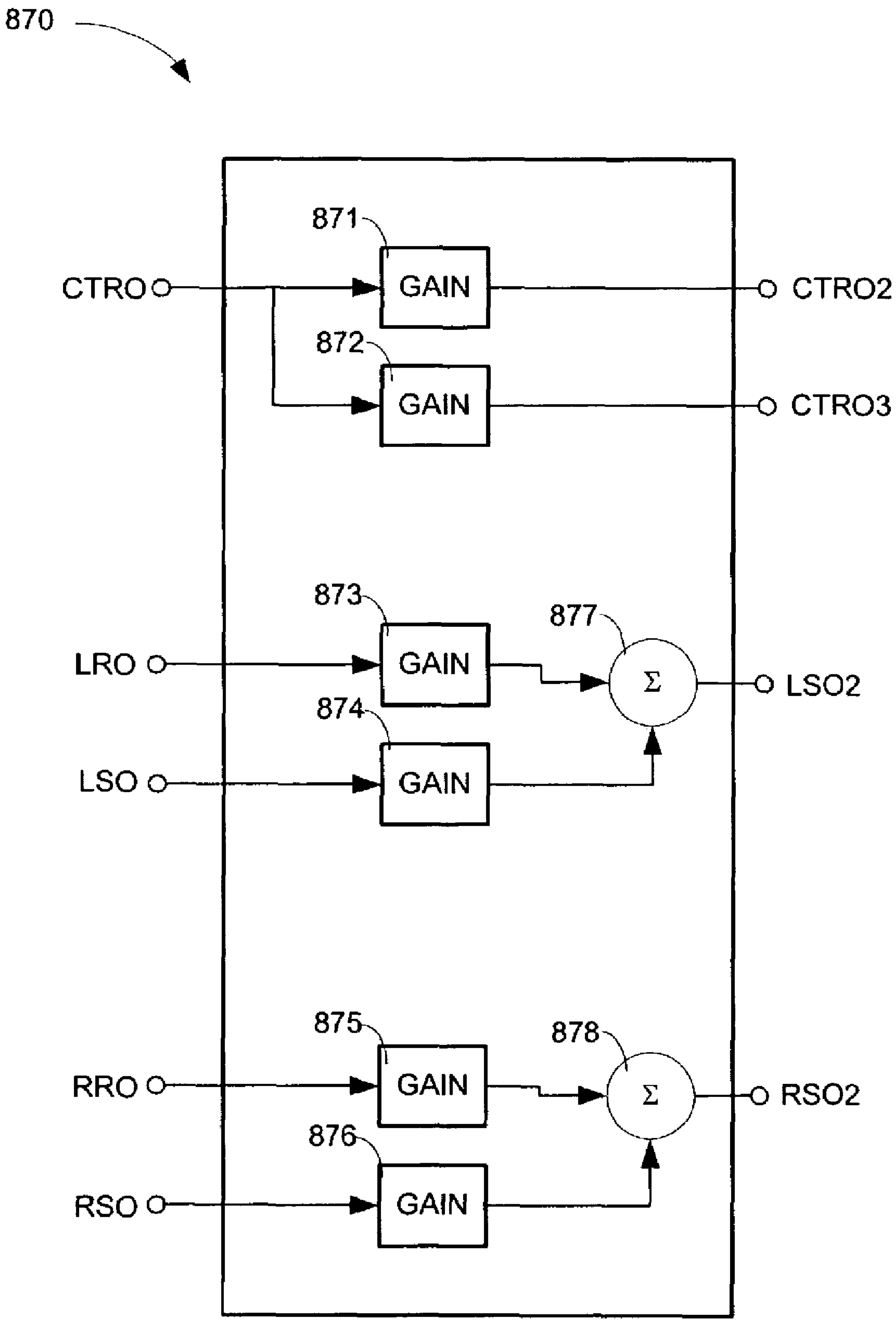
FIG. 8 is a block diagram of an additional output mixer.

Multi-channel matrix decoders may also include a mixer for creating additional output signals (an "additional output mixer"). An example of an additional out put mixer is shown in FIG. 8 and indicated by reference number 870. The additional output mixer 870 may be coupled to (as shown in FIG. 7) rear delay 756, rear delay 758, side delay 760, side delay 762, to receive RRO, LRO, RSO, and LSO, respectively, and to the matrix decoder 736 to receive CTRO. From RRO, LRO, RSO, LSO, and CTRO, the additional output mixer 870 creates four additional output signals including, CTRO2, CTRO3, LSO2, and RSO2.

The additional output mixer 870, as shown in FIG. 8, may be a crossbar mixer and may include several gain modules 871, 872, 873, 874, 875 and 876, and two summing modules 877 and 878. The additional output mixer 870 may receive all seven output signals or only CTRO, LRO, LSO, RRO and RSO. If the additional output mixer 870 receives all seven input signals, LFO and RFO will pass through the additional output mixer 870 without being processed. CTRO is coupled to gain modules 871 and 872, which each apply a gain to CTRO to create additional outputs CTRO2 and CTRO3. The gains applied by gain modules 871 and 872 may not be equal. A gain is applied to LRO and LSO by gain modules 873 and 874, respectively. The gains applied by gain modules 873 and 874 may not be equal. The gain-applied LRO and LSO are added using summing module 877 to create additional output LSO2. Similarly, a gain is applied to RRO and RSO by gain modules 875 and 876, respectively. The gains applied by gain modules 875 and 876 may not be equal. The gain-applied RRO and RSO may be added using summing module 878 to create additional output RSO2. These gains may be determined empirically.

3. Mixer:

The mixer 160 shown in FIG. 1 may be used in conjunction with the bass management module 110 and combines the high frequency output signals created by the matrix decoder module 120 with the low frequency input signals and SUB signal created by the bass management module 110. The mixer 160 may be coupled to the matrix decoder module 120 and bass management module 110.

Figure 9:
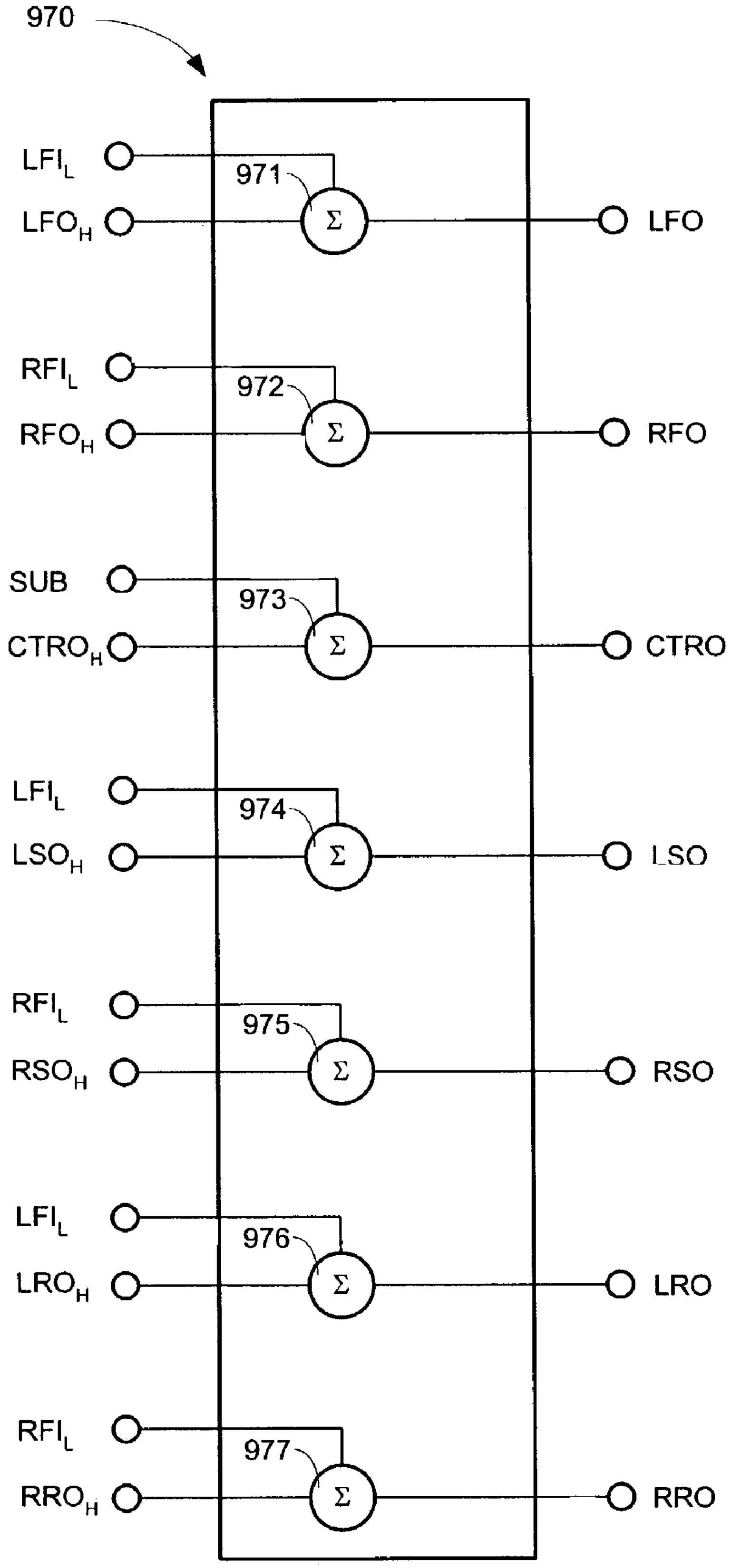
FIG. 9 is a block diagram of a mixer.

An example of a mixer that may be used to combine the high frequency output signals created by a 2×7 matrix decoder with the low frequency input signals created by a bass management module is shown in FIG. 9. The mixer 970 may include several summation modules 971, 972, 973, 974, 975, 976 and 977, which combine the high frequency output signals created by a 2×7 matrix decoder ($LFO_H$, $RFO_H$, $CTRO_H$, $LSO_H$, $RSO_H$, $LRO_H$ and $RRO_H$) with the low frequency input signals ($LFI_L$, $RFI_L$) and the SUB signal created by a bass management module to produce full-spectrum output signals LFO, RFO, CTRO, LSO, RSO, LRO and RRO, according to equations (3) through (9) respectively.

Figure 10:
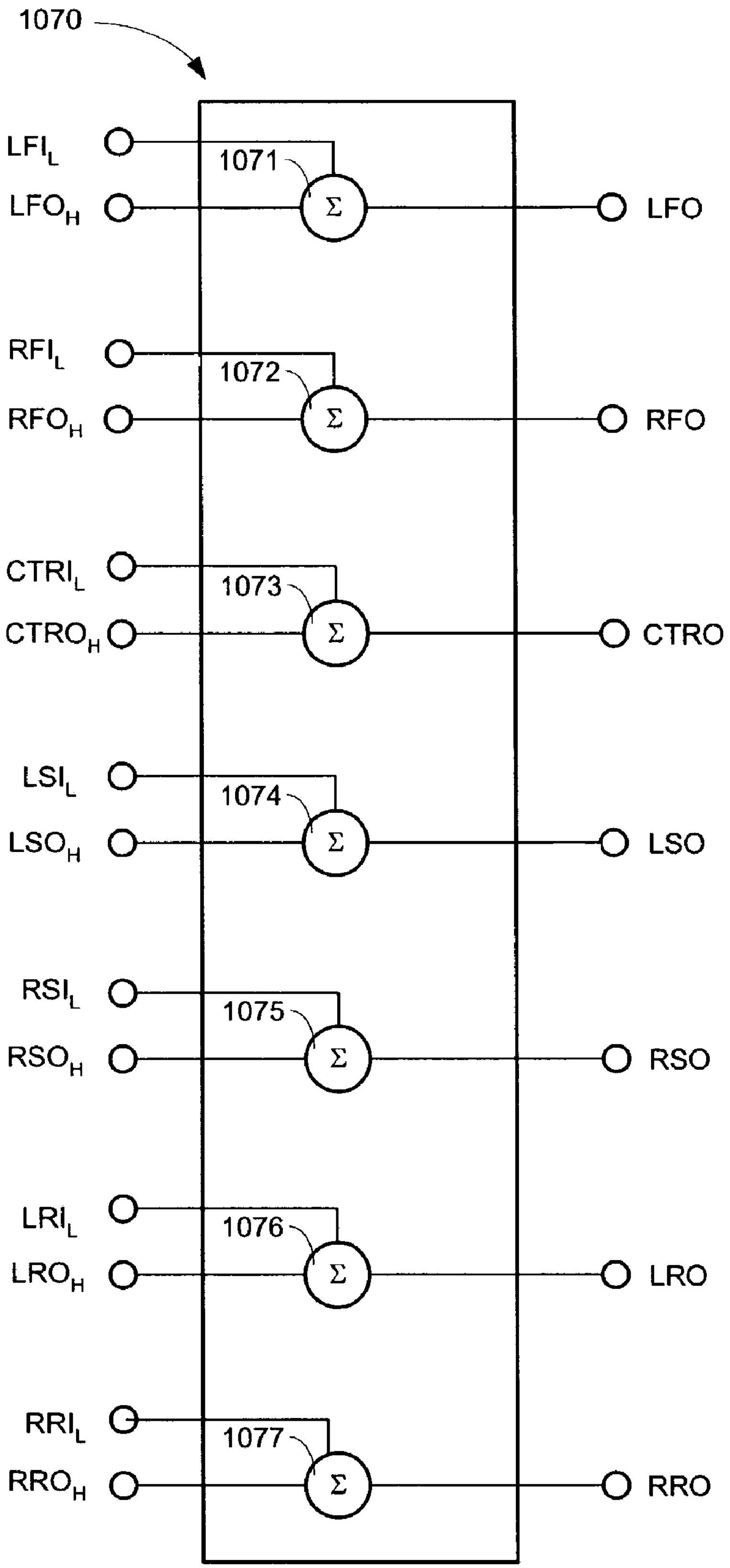
FIG. 10 is a block diagram of another mixer.

An example of a mixer that may be used to combine the high frequency output signals created by a 5×7 matrix decoder with the low frequency input signals created by a bass management module is shown in FIG. 10. The mixer 1070 may include several summation modules 1071, 1072, 1073, 1074, 1075, 1076 and 1077, which combine the high frequency output signals created by a 5×7 matrix decoder ($LFO_H$, $RFO_H$, $CTRO_H$, $LSO_H$, $RSO_H$, $LRO_H$ and $RRO_H$) with the low frequency input signals ($LFI_L$, $RFI_L$, $CTRI_L$, $LSI_L$, $RSI_L$, $LRI_L$ and $RRI_L$) created by a bass management module to produce full-spectrum output signals LFO, RFO, CTRO, LSO, RSO, LRO and RRO, according to equations (10) through (16) respectively.

Figure 11:
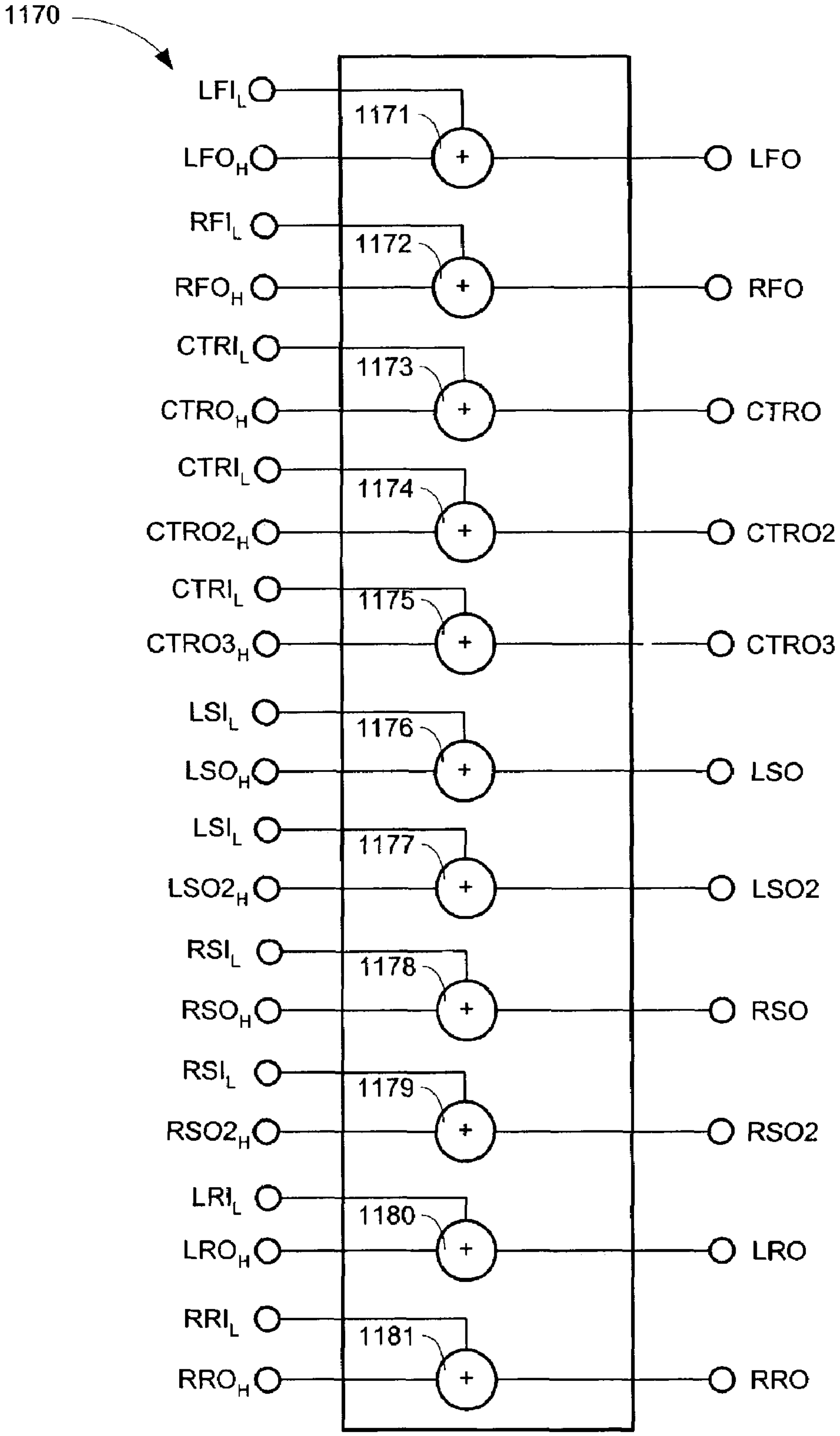
FIG. 11 is a block diagram of a further mixer.

An example of a mixer that may be used to combine the high frequency output signals created by a 5×11 matrix decoder with the low frequency input signals created by a bass management module is shown in FIG. 11. The mixer 1170 generally includes several summation modules 1171, 1172, 1173, 1174, 1175, 1176, 1177, 1178, 1179, 1180 and 1181, which combine the high frequency output signals created by a 5×11 matrix decoder ($LFO_H$, $RFO_H$, $CTRO_H$, $CTRO2_H$, $CTRO3_H$, $LSO_H$, $LSO2_H$, $RSO_H$, $RSO2_H$, $LRO_H$ and $RRO_H$) with the low frequency input signals ($LFI_L$, $RFI_L$, $CTRI_L$, $LSI_L$, $RSI_L$, $LRI_L$, and $RRI_L$) created by a bass management module to produce full-spectrum output signals LFO, RFO, CTRO, LSO, RSO, LRO, RRO, CTRO2, CTRO3, LSO2, and RSO2 according to equations (10) through (20) respectively. This mixer 1170 may be extended to create additional full-spectrum side output signals by including additional summation modules to add any additional high frequency side output signals to the corresponding low frequency surround signals. Alternately, if the low frequency input signals created by a bass management module include additional low frequency side input signals, such as: $LSI2_L$ and $RSI2_L$, these additional low frequency side input signals may be added to the corresponding additional high frequency output signals, such as $LSO2_H$ and $RSO2_H$, respectively.

It is often advantageous to be able to customize the sound waves produced by a sound processing system, such as that shown in FIG. 1, for a particular listening environment. Therefore, the sound processing system 100 may include an adjustment module 180. The adjustment module 180, may receive full-spectrum output signals from the matrix decoder module 120, or the mixer 160, or high frequency output signals from the matrix decoder module 120 and low frequency input signals from the bass management module 110. From the signals it receives, the adjustment module 180 produces signals that have been adjusted for a particular listening environment (the adjusted output signals). Additionally, the adjustment module 180 may create additional adjusted output signals. For example, when five output signals are being produced, the adjusted output signals include an adjusted left-front output signal LFO', an adjusted right-front output signal RFO', an adjusted center output signal CTRO', an adjusted left-rear output signal LRO', and adjusted left-side output signal LSO', and adjusted right-rear output signal RRO' and an adjusted right-side output signal RSO'. When eleven output signals are being produced, the seven prior mentioned adjusted output signals are produced along with a second adjusted center output signal CTRO2', a third adjusted center output signal CTRO3', a second adjusted left-side output LSO2' and a second adjusted right-side output RSO2'.

Adjusting the output signals for a particular listening environment may include determining and applying the appropriate gain, equalization and delay to each of the output signals. Initial values for the gain, equalization and delay may be assumed and then empirically adjusted within the particular listening environment. For example, a delay may be applied to signals that are to be reproduced a distance away from where the front signals are to be reproduced. The length of the delay may be a function of the distance from the location in which the front output signals are to be reproduced. For example, a delay may be applied to the side output signals and the rear output signals, where the delay applied to the rear output signals may be longer than the delay applied to the side output signals. The gains and equalization may be selected to compensate for non-uniformities among any electronic-to-sound wave transformers that may be used to produce sound from the output signals.

Figure 12:
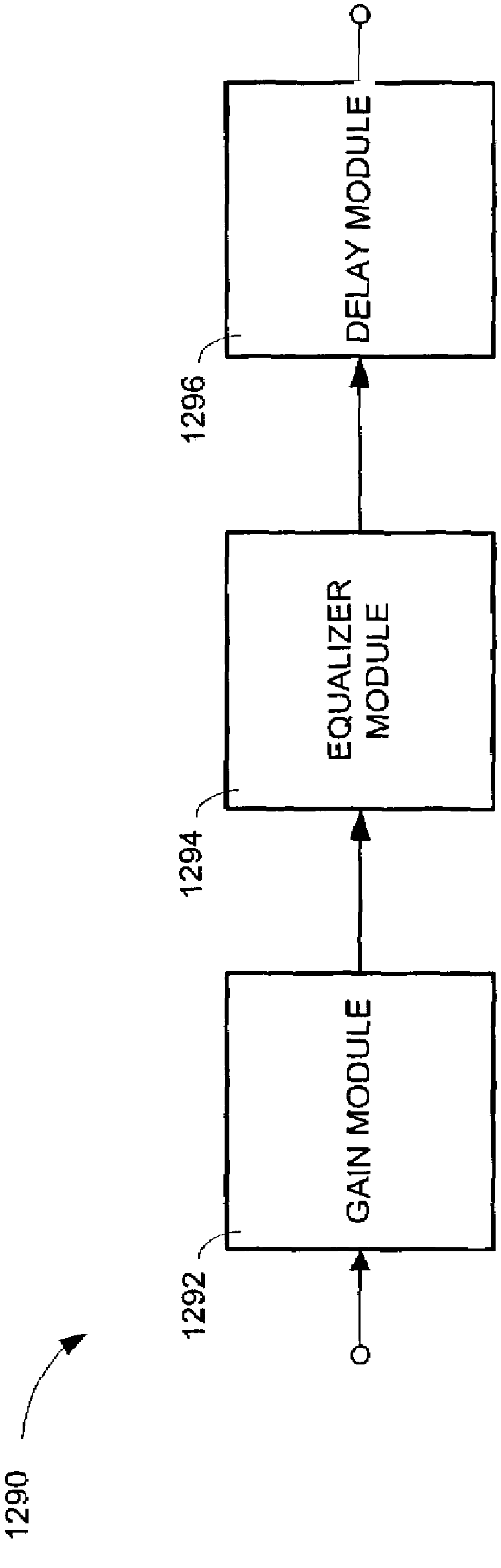
FIG. 12 is a block diagram of an adjustment module.

An example of an adjustment module is shown in FIG. 12. The adjustment module 1290 may include a gain unit 1292, an equalizer unit 1294 and a delay unit 1296. The gain module 1292, equalizer module 1294 and delay module 1296, may adjust the output signals for a particular listening environment or type of listening environment to create the adjusted output signals. The gain module 1292, equalizer module 1294 and delay module 1296, may include a separate gain unit, equalizer unit and delay unit, respectively, for each signal received by the adjustment module 1290. Therefore, if the adjustment module 1290 receives signals from the bass management module and the matrix decoder, twice as many gain, equalization and delay units will be needed. The separate gain units each may receive a different signal in a different channel and then couple each signal along to a separate equalizer unit in the equalizer module 1294. The signals may then be coupled to a separate delay unit in the delay module 1296 to create the adjusted output signals. The gains, equalization, and delays applied by these gain units, equalizer units, and delay units may be empirically determined in the particular listening environment and may be determined from assumed initial values. The gains and equalization may be selected to compensate for non-uniformities among any electronic-to-sound wave transformers that may be used to produce sound from the output signals.

Figure 13:
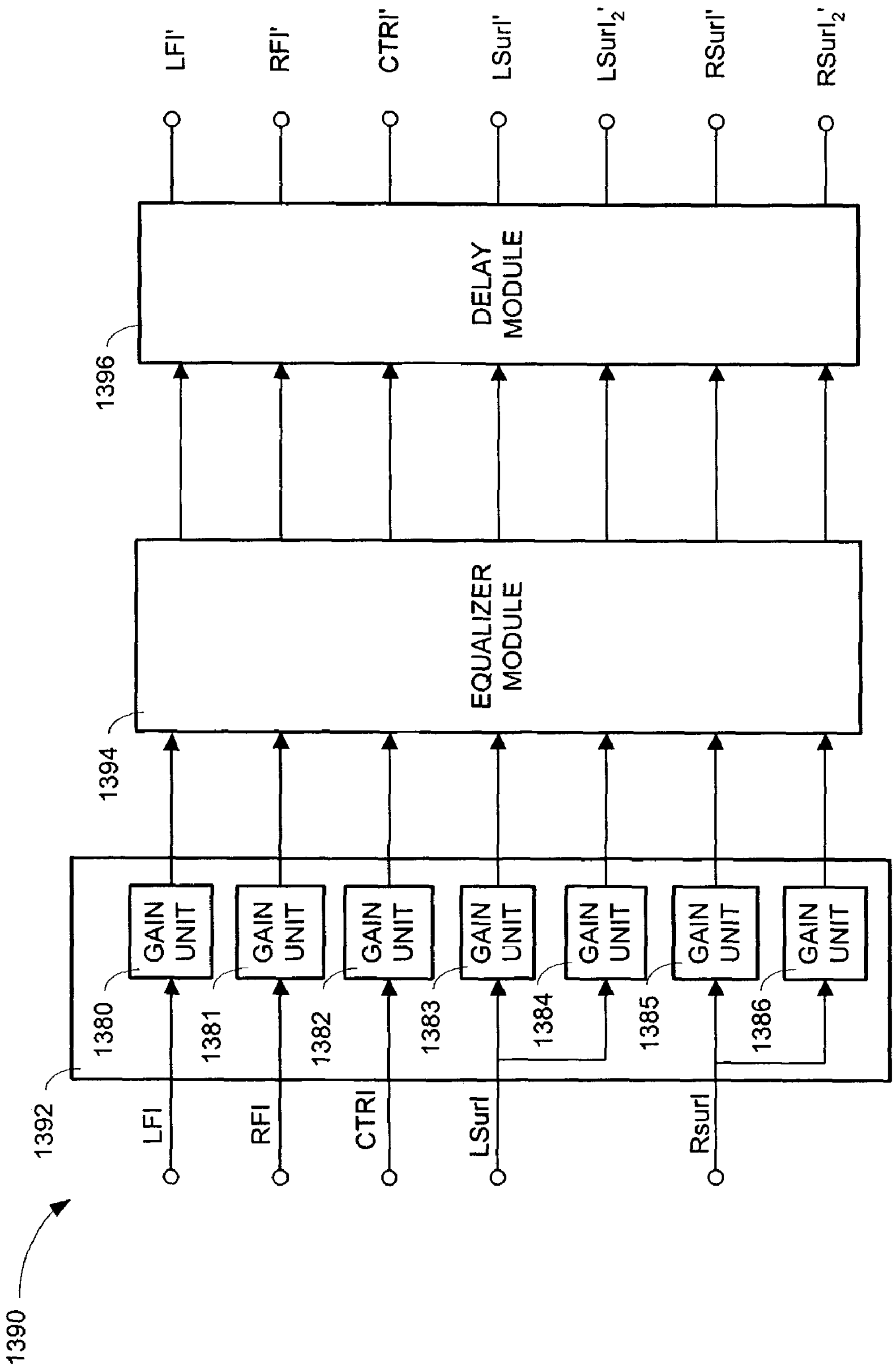
FIG. 13 is a block diagram of an adjustment module.

The sound processing system 100 of FIG. 1 may also operate in an alternate mode in which the matrix decoder module 120 is disengaged. In this case, the bass management module 110 and the mixer 160, if included, may also be disengaged. When the sound processing system 100 operates in this alternate mode, the adjustment module 180 may also operate in an alternate mode to create additional adjusted output signals to replace those that would have been created by the disengaged matrix decoder module 120. A block diagram of an adjustment module designed to tune seven signals operating in this additional mode is shown in FIG. 13. While a particular configuration is shown, other configurations may be used including those with fewer or additional components. The adjustment module in an alternate mode 1390 generally creates two additional output signals from five discrete input signals and may include a gain module 1392, an equalizer module 1394, and a delay module 1396, where each may contain the same number of gain units, equalizer units and delay units as it did in the non-alternate mode. However, in the alternate mode, some of the signals received by the adjustment module 1392 may be coupled to more than one gain unit. The gain module 1392 may include seven gain units 1380, 1381, 1382, 1383, 1384, 1385, and 1386. Gain units 1380, 1381, 1382, 1383 and 1385 may each receive a separate discrete input signal LFI, RFI, CTRI, LSurI and RSurI, respectively, and may couple the signals to separate equalizer units (not shown) within the equalizer module 1394. The signals may then be coupled to separate delay units (not shown) within the delay module 1396 to create adjusted output signals LFI', RFI', CTRI', LSurI' and RsurI'. However, gain unit 1384 also receives LSurI, which it may couple to a separate equalizer unit (not shown) within the equalizer module 1394. LSurI may then be coupled to a separate d clay unit (not shown) within the delay module 1396 to create an additional adjusted output signal LsurI'. Similarly, gain unit 1386 receives RSurI, which it may coupled to a separate equalizer unit (not shown) within the equalizer module 1394. RSurI may then be coupled to a separate delay unit (not shown) within the delay module 1396 to create an additional adjusted output signal $RsurI'_2$.

Figure 14:
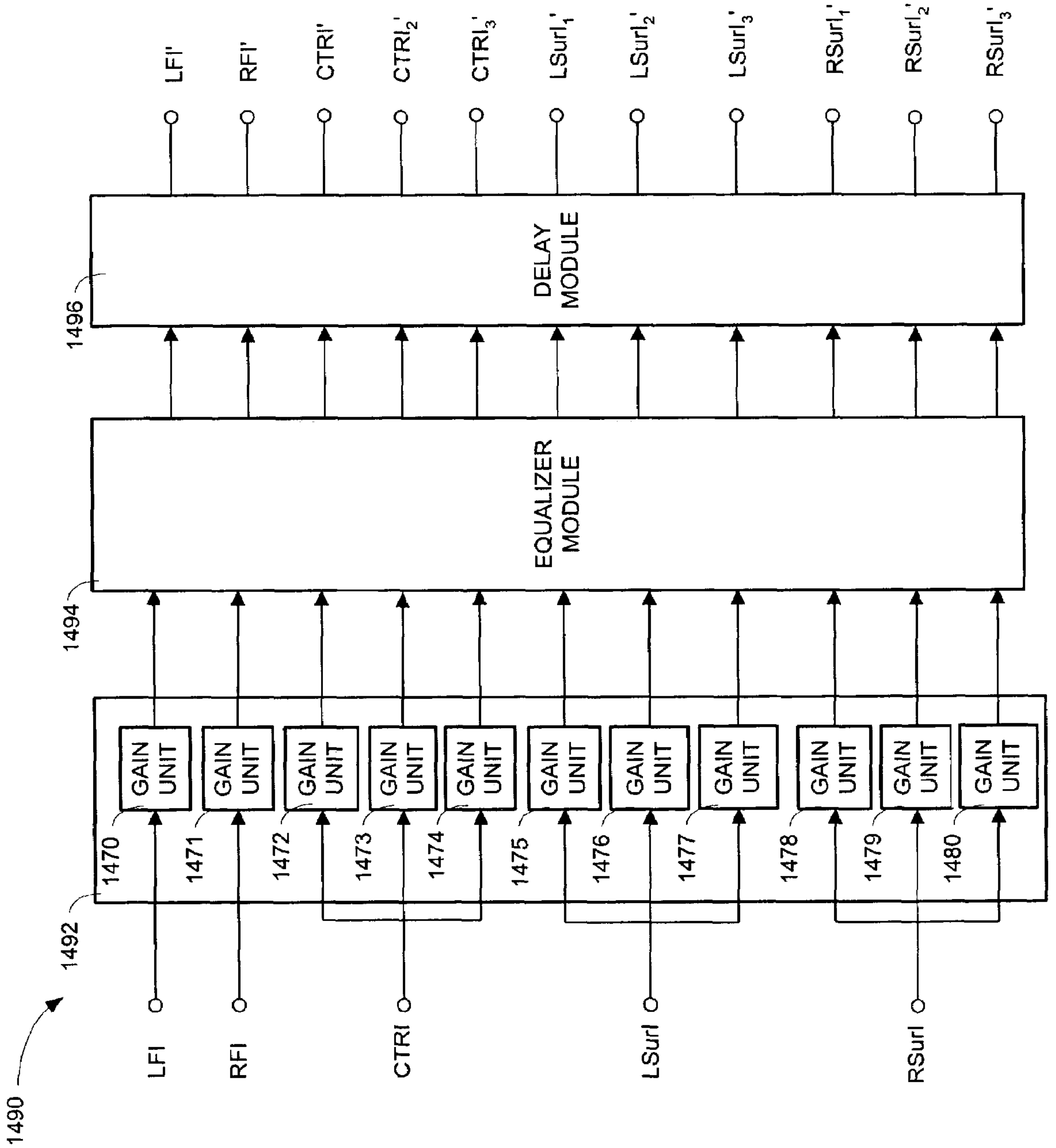
FIG. 14 is a block diagram of another adjustment module with the multi-channel matrix decoder module turned off.

A block diagram of an adjustment module designed to tune eleven signals that is operating in an alternate mode is shown in FIG. 14 and indicated by reference number 1490. While a particular configuration is shown, other configurations may be used including those with fewer or additional components. The adjustment module in an alternate mode 490 may create six additional output signals from five discrete input signals and may include a gain module 1492, an equalizer module 1494, and a delay module 1496, where each may contain the same number of gain units, equalizer units and delay units as it did in the non-alternate mode. However, in the alternate mode, some of the signals received by the adjustment module 1492 may be coupled to more than one gain unit. The gain module 1492 may include eleven gain units 1470, 1471, 1472, 1473, 1474, 1475, 1476, 1477, 1478, 1479 and 1480. Gain units 1470, 1471, 1472, 1475 and 1478 may each receive a separate discrete input signal LFI, RFI, CTRI, LSurI and RSurI, respectively, and couple the signals to separate equalizer units (not shown) within the equalizer module 1494. The signals may then be coupled to separate delay units (not shown) within the delay module 1496 to create adjusted output signals LFI', RFI', CTRI', LSurI' and RsurI'. However, gain units 1473 and 1474 may also receive CTRI, which each may be coupled to separate equalizer units (not shown) within the equalizer module 1494. The signals may then be coupled to separate delay units (not shown) within the delay module 1496 to create additional adjusted center output signals $CTRI_2'$ and $CTRI_3'$. Similarly, gain units 1476 and 1477 may each receive LSurI, which each may be coupled to a separate equalizer unit (not shown) within the equalizer module 1494. The signals may then be coupled to a separate delay unit (not shown) within the delay module 1496 to create additional adjusted left-side output signals $LsurI_2'$ and $LsurI_3'$. Similarly, gain units 1479 and 1480 may each receive RSurI, which each may be coupled to a separate equalizer unit (not shown) within the equalizer module 1494. The signals may then be coupled to a separate delay unit (not shown) within the delay module 1496 to create an additional adjusted output signal RsurI'.

Figure 15:
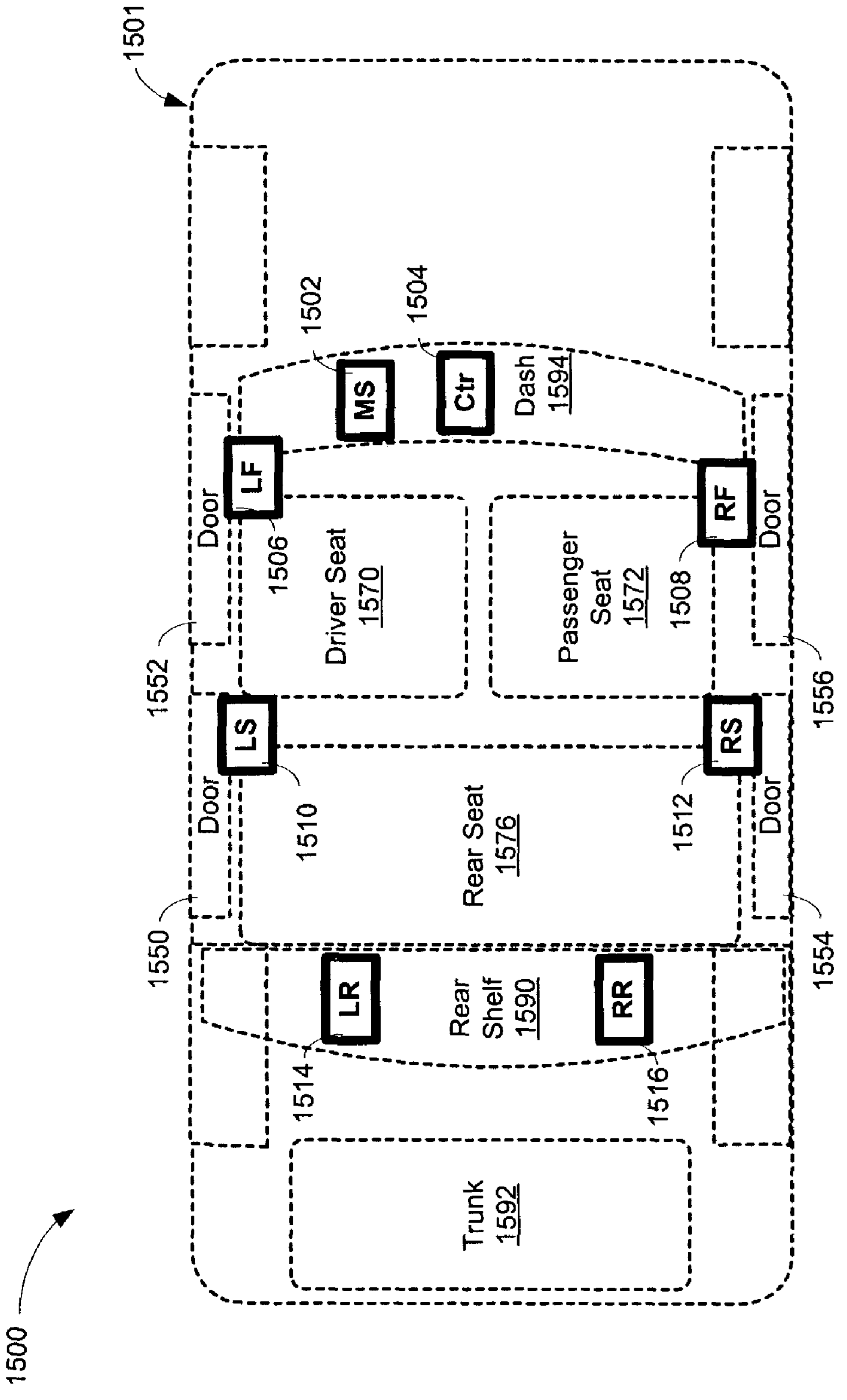
FIG. 15 is a block diagram of a vehicular multi-channel sound processing system.

5. Vehicular Multi-Channel Sound Processing Systems:

Sound processing systems may be implemented in any type of listening environment and may also be designed for a particular type of listening environment. An example of a multi-channel sound processing system implemented in a vehicular listening environment (a "vehicular multi-channel sound processing system") is shown in FIG. 15. In this example, the vehicular multi-channel sound processing system 1500 is located within a vehicle 1501 that includes doors 1550, 1552, 1554 and 1556, a driver seat 1570, a passenger seat 1572, and a rear seat 1576. While a four-door vehicle is shown, the vehicular multi-channel sound processing system 1500 may be implemented in vehicles having a greater or lesser number of doors. The vehicle may be an automobile, truck, bus, train, airplane, boat, or the like. Although only one rear seat is shown, smaller vehicles may have only one or two seats with no rear seat, while larger vehicles may have more than one rear seat or multiples rows of rear seats. While a particular configuration is shown, other configurations may be used including those with fewer or additional components.

The vehicular multi-channel sound processing system 1500 includes a multi-channel surround processing system (MS) 1502, which may include any or a combination of the surround processing systems previously described that include a multi-channel matrix decoder and/or a multi-channel matrix decoding method. The multi-channel surround processing system may also include a bass management module and may further include a mixer as previously described. The vehicular multi-channel sound processing system 1500 includes a signal source (not shown) that may be located in the dash 1594, trunk 1592 or other locations throughout the vehicle that couples a digital signal to the multi-channel surround processing system. The vehicular multi-channel sound processing system 1500 also includes more than one loudspeakers located throughout the vehicle 1501 either directly or indirectly through a post-processing module. The speakers may include a front center speaker ("CTR speaker") 1504, a left-front speaker ("LF speaker") 1506, a right-front speaker ("RF speaker") 1508, and at least one pair of surround speakers. The surround speakers may include a left-side speaker ("LS speaker") 1510 and a right-side speaker ("RS speaker") 1512, a left-rear speaker ("LR speaker") 1514 and a right-rear speaker ("RR speaker") 1516, or a combination of speaker sets. Other speaker sets may be used. While not shown, one or more dedicated subwoofer or other drivers may be present. The dedicated subwoofer or other drivers may receive a SUB or LFE signal from a bass management module. Possible subwoofer mounting locations include the trunk 1592 and the rear shelf 1590.

The CTR speaker 1504, LF speaker 1506, RF speaker 1508, LS speaker 1510 RS speaker 1512, LR speaker 1514, and RR speaker 1516 may be located within the vehicle 1501 surrounding the area in which passengers are normally seated. The CTR speaker 1504 may be located in front of and between the driver seat 1570 and the passenger seat 1572. For example, the CTR speaker 1504 may be located within the dash 1594. The LR and RR speakers 1514 and 1516, respectively, may be located behind and towards either end of the rear seat 1576. For example, the LR and RR speakers 1514 and 1516, respectively, may be located in the rear shelf 1590 or other space in the rear of the vehicle 1501. The front speakers, which may include the LF and RF speakers, 1506 and 1508, respectively, may be located along the sides of the vehicle 1501 and towards the front of the driver seat 1570 and the passenger seat 1572, respectively. Likewise, the side speakers, which include the LS and RS speakers 1510 and 1512, respectively, may be similarly located with respect to the rear seat 1576. Both the front and side speakers may, for example, be mounted in the doors 1552, 1556, 1550 and 1554 of the vehicle 1501. In addition, the speakers may each include one or more speaker drivers such as a tweeter and a woofer. The tweeter and woofer may be separately driven by high frequency output signals and low frequency input signals, respectively, which may be received directly from a bass management module or from one or more crossover filters. The tweeter and woofer may be mounted adjacent to each other in essentially the same location or in different locations. LF speaker 1506 may include a tweeter located in door 1552 or elsewhere at a height roughly equivalent to a side mirror and may include a woofer located in door 1552 beneath the tweeter. The LF speaker 1506 may have other arrangements of the tweeter and woofer. The CTR speaker 1504 may be mounted in the front dashboard 1594, but could be mounted in the ceiling, on or near a rear-view mirror (not shown), or elsewhere in the vehicle 1501.

In one mode of operation of the vehicular multi-channel sound processing system 1500, the multi-channel surround processing system 1502 may produce seven full-spectrum output signals LFO', RFO', CTRO', LRO', LSO', RRO' and RSO', each in one of seven different output channels. LFO', RFO', CTRO', LRO', LSO', RRO' and RRO' may then be coupled to a post-processing module and may then proceed through crossover filters to the LF speaker 1506, RF speaker 1508, CTR speaker 1504, LR speaker 1514, LS speaker 1510, RR speaker 1516, and RS speaker 1512, respectively, for conversion into sound waves. Alternatively, the multi-channel surround processing system 1502 may produce seven high frequency output signals and seven low frequency input signals that may be coupled to a post-processing module and may then proceed to the tweeters and woofers, respectively of the appropriate speakers. In another mode of operation, in which the multi-channel surround processing system 1502 is not engaged, the vehicular multi-channel sound processing system 1500 may produce seven alternate output signals LFI', RFI', CTRI', $LsurI_1'$, $LsurI_2'$, $RsurI_1'$, and $RsurI_2'$, each in one of seven different output channels. LFI', RFI', CTRI', $LsurI_1'$, $LsurI_2'$, $RsurI_1'$, and $RsurI_2'$ may be coupled to a post-processing module and then directly or indirectly coupled to the LF speaker 1506, RF speaker 1508, CTR speaker 1504, LR speaker 1514, LS speaker 1510, RR speaker 1516, and RS speaker 1512, respectively, for conversion into sound waves. In either mode, the multi-channel surround processing system 1502 may also produce an LFE or SUB signal in a separate channel. The LFE or SUB signal may be converted into sound waves by a loudspeaker located within the vehicle (not shown).

The multi-channel surround processing system 1502 may also include an adjustment module. The gain, frequency response and delay for each gain, equalizer and delay unit, respectively, may be given initial values, which may then be adjusted when the vehicular multi-channel sound processing system 1500 of FIG. 15 is installed in a vehicle. In general, the initial values may be those previously described or other values particularly suited for a particular vehicle, vehicle type, or class. When the vehicular multi-channel sound processing system 1500 is installed in the vehicle 1500, the initial values may be adjusted according to methods previously described to determine the adjusted values for the gain, frequency response and delay for each gain module, equalizer and delay, respectively. The gains and equalization may be selected to compensate for non-uniformities among any electronic-to-sound wave transformers that may be used to produce sound from the output signals.

Figure 16:
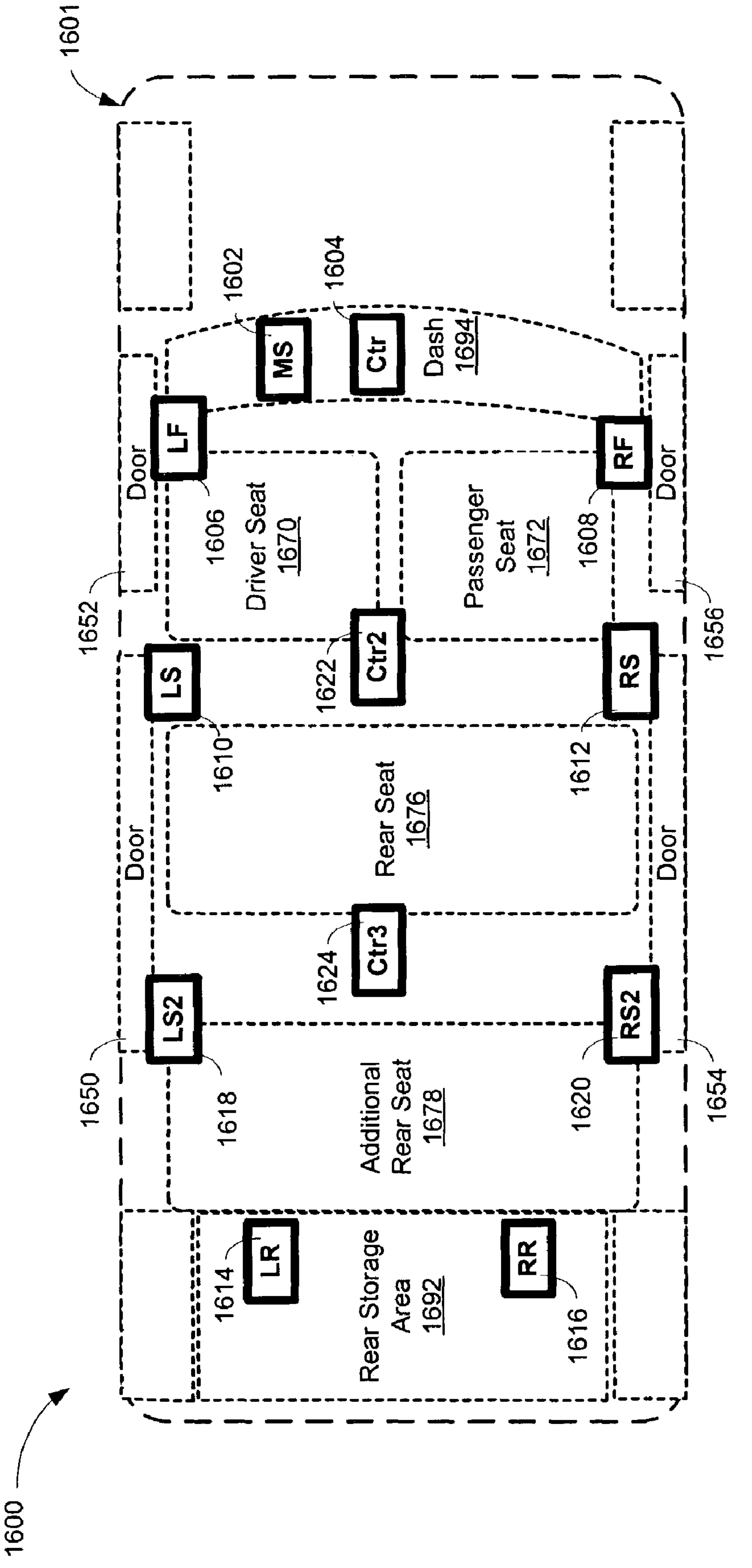
FIG. 16 is a block diagram of another vehicular multi-channel sound processing system.

Sound processing systems may also be implemented in larger vehicular listening environments, such as those having multiple rows of rear seats ("larger vehicles"). An example of a vehicular multi-channel sound processing system implemented in a larger vehicle is shown in FIG. 16. The vehicular multi-channel sound processing system 1600 is located within a vehicle 1601 that includes doors 1650, 1652, 1654 and 1656, a driver seat 1670, a passenger seat 1672, a rear seat 1676 and an additional rear seat 1678. While a four-door vehicle is shown, the vehicular multi-channel sound processing system 1600 may be used in vehicles having a greater or lesser number of doors. The vehicle may be an automobile, bus, train, truck, airplane, boat or the like. Although only one additional rear seat is shown, other larger vehicles may have more than two rear seats or rows of rear seats. While a particular configuration is shown, other configurations may be used including those with fewer or additional components.

This vehicular multi-channel sound processing system 1600 includes a multi-channel surround processing system (MS) 1602, which may include any or a combination of the surround processing systems previously described that include a multi-channel matrix decoder and/or implement a multi-channel matrix decoding method. The vehicular multi-channel sound processing system 1600 may include a signal source (not shown), which may be located in the dash 1594, rear storage area 1692, or other locations within the vehicle. The multi-channel surround processing system 1602 may also include a bass management module and may further include a mixer as previously described. The vehicular multi-channel sound processing system 1600 may also include several loudspeakers located throughout the vehicle 1601, either directly or indirectly through a post-processing module. The speakers including a group of center speakers, an LF speaker 1606, an RF speaker 1608, and at least two pairs of surround speakers. The group of center speakers may include a center speaker ("CTR") 1604, a second center speaker ("CTR2") 1622 and a third center speaker ("CTR3") 1624. The surround speakers may include an LS speaker 1610, a second left-side speaker ("LS2 speaker") 1618, an RS speaker 1612, a second right-side speaker ("RS2 speaker") 1620, an LR speaker 1614 and an RR speaker 1616, or a combination of speaker sets. Other speaker sets may be used. While not shown, one or more dedicated subwoofer or other drivers may be present. The dedicated subwoofer of other drivers may receive a SUB or LFE signal from a bass management module. Possible subwoofer mounting locations include the rear storage area 1692.

The CTR, LF, RF, LS, RS, LR and LS speakers, 1604, 1606, 1608, 1610, 1612, 1614 and 1616, respectively, may be located in a manner similar to the corresponding speakers described previously in connection with FIG. 15. In FIG. 16, the LS2 and RS2 speakers, 1618 and 1620, respectively, may be located in proximity to the additional rear seat 1678 and may be located within doors 1650 and 1654, respectively. The CTR2 speaker 1622 and CTR3 speaker 1624 may be centrally located in front of the rear seat 1676 and additional rear seat 1678, respectively. The CTR2 speaker 1622 and the CTR3 speaker 1624 may be suspended from the roof of the vehicle 1601, or imbedded in the driver seat 1670 or passenger seat 1672, and the rear seat 1676, respectively. In addition, the CTR2 speaker 1622 and CTR3 speaker 1624 may be mounted along with a visual display module, to provide the sound for a movie, program or the like. In addition, the speakers may each include one or more speaker drivers such as a tweeter and a woofer in manners and locations similar to those previously described in connection with FIG. 15.

In one mode of operation of the vehicular multi-channel sound processing system 1600, the multi-channel surround processing system 1602 may produce eleven full-spectrum output signals LFO', RFO', CTRO', CTRO2', CTRO3', LRO', LSO', LSO2', RRO', RSO', and RSO2', each in one of eleven different output channels. LFO', RFO', CTRO', CTRO2', CTRO3', LRO', LSO', LSO2', RRO', RSO', and RSO2' may then be coupled to a post-processing module and may then proceed through crossover filters to the LF speaker 1506, RF speaker 1508, CTR speaker 1504, CTR2 speaker 1522, CTR3 speaker 1524, LR speaker 1514, LS speaker 1510, LS2 speaker 1550, RR speaker 1516, RS speaker 1512 and RS2 speaker 1520, respectively, for conversion into sound waves. Alternatively, the multi-channel surround processing system 1602 may produce eleven high frequency output signals and eleven low frequency input signals that may be coupled to a post-processing module and then to the tweeters and woofers, respectively of the appropriate speakers. In another mode of operation in which the multi-channel surround processing system 1602 is not engaged, the vehicular multi-channel sound processing system 1600 may produce eleven alternate output signals LFI', RFI', CTRI', CTRI$_2$', CTRI$_2$', LRI', LSI', LS1$_2$', RRO', RSO', and RSO2', each in one of eleven different channels. The alternate output signals, ALFO', ARFO', and ACTRO', may correspond to discrete input signals created by a discrete signal decoder, LFI, RFI, and CTR, respectively. LFI', RFI', CTRI', CTRI$_2$', CTRI$_2$', LRI', LSI', LS1$_2$', RRO', RSO', and RSO2' may be coupled to a post-processing module and then directly or indirectly coupled to the LF speaker 1606, RF speaker 1608, CTR speaker 1604, CTR2 speaker 1622, LR speaker 1614, LS speaker 1610, LS2 speaker 1618, RR speaker 1616, RS speaker 1612, and RS2 speaker 1620, respectively, for conversion into sound waves. In either mode, the multi-channel surround processing system 1602 may also produce an LFE or SUB signal in a separate channel. The LFE or SUB signal may be converted into sound waves by a loudspeaker located within the vehicle (not shown).

The multi-channel surround processing system 1602 may also include an adjustment module. The gain, frequency response and delay for each gain module, equalizer and delay, respectively, may be given initial values, which may then be adjusted when the vehicular multi-channels surround system 1600 is installed in a vehicle. In general, the initial values may be those previously described or other values particularly suited for a particular vehicle, vehicle type or class. When the vehicular multi-channels surround system 1600 is installed in the vehicle 1600, the initial values may be adjusted according to methods previously described to determine the adjusted values for the gain, frequency response and delay for each gain module, equalizer and delay, respectively. The gains and equalization may be selected to compensate for non-uniformities among any electronic-to-sound wave transformers that may be used to produce sound from the output signals.

Figure 17:
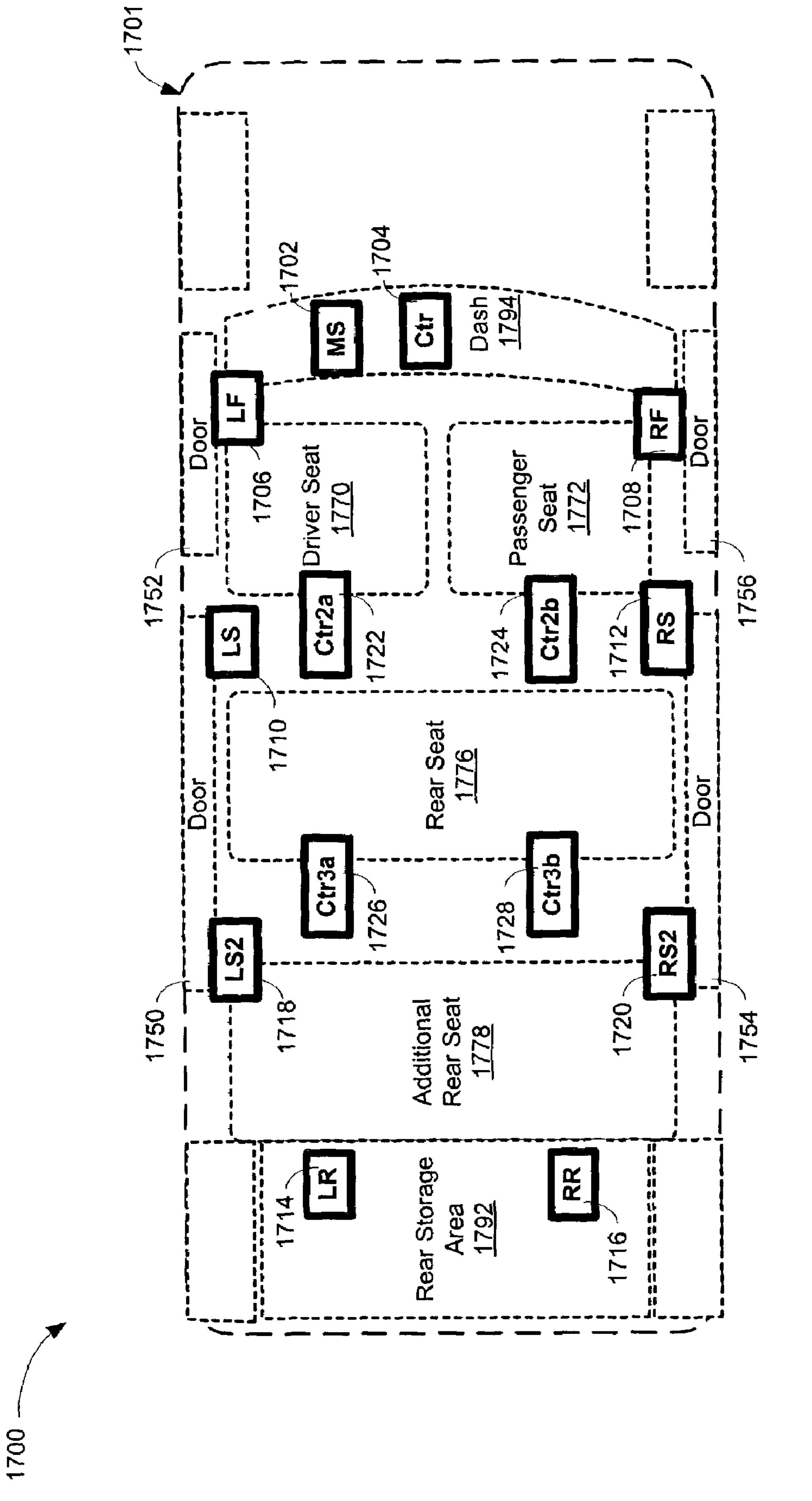
FIG. 17 is a block diagram of a further vehicular multi-channel sound processing system.

Another example of a vehicular multi-channel sound processing system implemented in a larger vehicular listening environment is shown in FIG. 17. This vehicular multi-channel sound processing system 1700 may be implemented in a vehicle 1701, which may be similar to that described in connection with FIG. 16. In addition, the vehicular surround system 1700 of FIG. 17 may be about the same as the vehicular surround system described in connection with FIG. 16, except that the CTR2 speaker 1622, and CTR3 1624 speaker of FIG. 16 may each be replaced (as shown in FIG. 17) with a pair of speakers CTR2*a* 1722, CTR2*b* 1724 and CTR3*a* 1726, CTR3*b* 1728, respectively. The first pair of speakers CTR2*a* 1722, CTR2*b* 1724 may be suspended from the roof of the vehicle 1701 or embedded in the driver seat 1770 and the passenger seat 1772, respectively. The second pair of speakers CTR3*a* 1726 and CTR3*b* 1728 may also be suspended from the roof of the vehicle 1701 or embedded in the rear seat 1776. In addition, these speakers may be mounted along with a visual display device, to provide the sound for a movie, program or the like. When mounted along with a visual display device, each of these speakers may include a pair of speakers mounted on either side of the visual display device. In addition, these speakers may each include a terminal or jack for receiving headphones and may each include a separate volume control device.

Vehicular multi-channel sound processing systems may be implemented in larger vehicles with more than two rear seats, using multi-channel surround processing systems that include greater numbers of additional side and center outputs as previously described. These multi-channel surround processing systems may drive at least one additional speaker directly or indirectly with each additional side and center output signal. Each additional left-side speaker may be added along the side of the vehicle between the left-rear speaker and the nearest left-side speaker. Similarly, each additional right-side speaker may be added along the side of the vehicle between the right-rear speaker and the nearest right-side speaker. Each additional pair of side speakers may be located in proximity to additional rear seats in the vehicle, with at least one additional center speaker located about in parallel with each additional pair of side speakers.

While various embodiments of the invention have been described, it will be apparent to those of ordinary skill in the art that many more embodiments and implementations are possible within the scope of the invention. For example, although the multi-channel sound processing systems and matrix decoding systems (including methods, modules and software) disclosed in this document have been described as using five discrete input signals, the systems may also function using one, two, three or four input signals. So long as there are at least two input signals, the system produces a surround effect even in non-optimum listening environments. Accordingly, the invention is not to be restricted except in light of the attached claims and their equivalents.

What is claimed is:

1. A method for processing a plurality of audio input signals into a plurality of audio output signals, the plurality of audio output signals being a greater number than the plurality of audio input signals, comprising:

producing a plurality of initial low frequency input signals that comprise portions of the plurality of audio input signals that are at most about a cut-off frequency;

producing at least one additional low frequency input signal from the plurality of initial low frequency input signals;

producing a plurality of high frequency input signals that comprises portions of the plurality of audio input signals that are at least about the cut-off frequency;

decoding the plurality of high frequency input signals into a plurality of high frequency output signals according to a matrix decoding technique;

bypassing decoding of the said plurality of initial low frequency input signals and the additional low frequency input signal by any matrix decoding technique; and maintaining each of the said plurality of initial low frequency input signals and the additional low frequency input signal separately from each other, where the plurality of high frequency output signals, the plurality of initial low frequency input signals, and the additional low frequency input signal are included in the plurality of audio output signals.

2. The method of claim 1, where the cut-off frequency comprises a frequency from about 100 Hz to about 1000 Hz.

3. The method of claim 1, further comprising customizing the plurality of audio output signals for a listening environment.

4. The method of claim 1, where decoding the plurality of high frequency input signals into the plurality of high frequency output signals further comprises producing at least one additional high frequency output signal.

5. A method for processing a plurality of audio input signals into a plurality of audio output signals, comprising:

producing a plurality of low frequency input signals that comprise portions of the plurality of audio input signals that are at most about a cut-off frequency;

producing a plurality of high frequency input signals that comprises portions of the plurality of audio input signals that are at least about the cut-off frequency;

decoding the plurality of high frequency input signals into a plurality of high frequency output signals according to a matrix decoding technique;

bypassing decoding of the plurality of low frequency input signals by any matrix decoding technique; and maintaining each of the plurality of low frequency input signals separately from each other, where the plurality of high frequency output signals and the plurality of low frequency input signals are included in the plurality of audio output signals, where decoding the plurality of high frequency input signals into the plurality of high frequency output signals further comprises producing at least one additional high frequency output signal, and where producing at least one additional high frequency output signal comprises combining the plurality of low frequency input signals with the plurality of high frequency output signals.

6. The method of claim 1, where producing the plurality of initial low frequency input signals comprises removing frequencies that are above about the cut-off frequency from each of the plurality of audio input signals.

7. A method for processing a plurality of audio input signals into a plurality of audio output signals, comprising:

producing a plurality of low frequency input signals that comprise portions of the plurality of audio input signals that are at most about a cut-off frequency;

producing a plurality of high frequency input signals that comprises portions of the plurality of audio input signals that are at least about the cut-off frequency;

decoding the plurality of high frequency input signals into a plurality of high frequency output signals according to a matrix decoding technique;

bypassing decoding of the plurality of low frequency input signals by any matrix decoding technique; and maintaining each of the plurality of low frequency input signals separately from each other, where the plurality of high frequency output signals and the plurality of low frequency input signals are included in the plurality of audio output signals, where producing the plurality of low frequency input signals comprises:

removing frequencies that are above about the cut-off frequency from at least one of the plurality of audio input signals;

producing an initial plurality of low frequency input signals; and producing the plurality of low frequency input signals as a function of the initial low frequency input signals.

8. The method of claim 1, where producing the additional low frequency input signal comprises producing an additional plurality of low frequency input signals as a function of the plurality of initial low frequency input signals.

9. The method of claim 8, where the plurality of initial low frequency input signals comprises a low frequency effects signal, and producing the additional plurality of low frequency input signals further comprises producing the at least one of the additional plurality of low frequency input signals as a function of the low frequency effects signal.

10. The method of claim 9, where producing the additional plurality of low frequency input signals further comprises applying a gain to the low frequency effects signal.

11. A method for processing a left-front input signal, a right-front input signal, a center audio input signal, a left-surround input signal, and a right-surround input signal into a left-front output signal, a right-front output signal, a center output signal, a left-side output signal, a right-side output signal, a left-rear output signal, and a right-rear output signal, the method comprising:

producing an initial left-front low frequency input signal, an initial right-front low frequency input signal, an initial center low frequency input signal, an initial left-surround low frequency input signal, and an initial right-surround low frequency input signal by removing frequencies that are above about a cut-off frequency from the left-front, right-front, center, left-surround, and right-surround input signals, respectively;

producing a left-front low frequency input signal, a right-front low frequency input signal, a center low frequency input signal, a left-side low frequency input signal, a right-side low frequency input signal, a left-rear low frequency input signal, and a right-rear low frequency input signal as a function of the initial left-front, initial right-front, initial center, initial left-surround, and initial right-surround low frequency input signals;

producing a left-front high frequency input signal, a right-front high frequency input signal, a center high frequency input signal, a left-surround high frequency input signal and a right-surround high frequency input signal by removing frequencies that are below about the cut-off frequency from the left-front, right-front, center, left-surround, and right-surround input signals, respectively;

decoding the left-front, right-front, center, left-surround, and right-surround high frequency input signals into a left-front high frequency output signal, a right-front high frequency output signal, a center high frequency output signal, a left-side high frequency output signal, a right-side high frequency output signal, a left-rear high frequency output signal, and a right-rear high frequency output signal according to a matrix decoding technique;

causing the left-front, right-front, center, left-side, right-side, left-rear, and right-rear low frequency input signals to forgo the matrix decoding technique; and maintaining each of the left-front, right-front, center, left-side, right-side, left-rear, and right-rear low frequency input signals separately from each other, where left-front, right-front, center, left-side, right-side, left-rear, and right-rear low frequency input signals, and the left-front, right-front, center, left-side, right-side, left-rear, and right-rear high frequency output signals comprise the left-front, right-front, center, left-side, right-side, left-rear and right-rear output signals.

12. A method for processing a plurality of audio input signals into a plurality of audio output signals, comprising:

producing a plurality of low frequency input signals that comprise portions of the plurality of audio input signals that are at most about a cut-off frequency;

producing a plurality of high frequency input signals that comprises portions of the plurality of audio input signals that are at least about the cut-off frequency;

decoding the plurality of high frequency input signals into a plurality of high frequency output signals according to a matrix decoding technique;

bypassing decoding of the plurality of low frequency input signals by any matrix decoding technique; and maintaining each of the plurality of low frequency input signals separately from each other, where the plurality of high frequency output signals and the plurality of low frequency input signals are included in the plurality of audio output signals, where the method for processing the plurality of audio input signals into a plurality of audio output signals comprises processing a left-front input signal, and a right-front input signal into a left-front output signal, a right-front, center output signal, a left-surround output signal, and a right-surround output signal;

producing the plurality of low frequency input signals comprises producing a left-front low frequency input signal, and a right-front low frequency input signal by removing frequencies that are above about the cut-off frequency from the left-front, and right-front, input signals, respectively; and producing a further low frequency input signal as a function of the left-front, and right-front low frequency input signals;

producing the plurality of high frequency input signals comprises producing a left-front high frequency input signal, and a right-front high frequency input signal by removing frequencies that are below about the cut-off frequency from the left-front, and right-front input signals, respectively;

decoding the plurality of high frequency input signals comprises decoding the left-front, and right-front high frequency input signals into a left-front high frequency output signal, a right-front high frequency output signal, a center high frequency output signal, a left-surround high frequency output signal, and a right-surround high frequency output signal according to the matrix decoding technique;

communicating the plurality of low frequency input signals comprises communicating the left-front, right-front, and further low frequency input signals so as to bypass any decoding by the matrix decoding technique; and maintaining each of the plurality of low frequency input signals separately from each other comprises maintaining each of the left-front, right-front, and further low frequency input signals separately from each other.

13. The method of claim 12, further comprising producing at least one more high frequency input signal, at least one more left-side high frequency output signal, and at least one more right-side high frequency output signal as a function of the center, left-side, right-side, left-rear, and right-rear high frequency output signals.

14. The method of claim 13, further comprising combining the center, second center, third center, second left-side, and second right-side high frequency output signals, with the center, left-side, right-side, left-rear, and right-rear low frequency input signals include in a second center output signal, a third center output signal, a second left-side output signal, and a second right-side output signal.

15. A system for processing a plurality of audio input signals into a plurality of audio output signals, the plurality of audio output signals being a greater number than the plurality of audio input signals, comprising:

a bass management module in communication with the plurality of audio input signals configured to produce a plurality of initial low frequency input signals comprising portions of the plurality of audio input signals that are at most about a cut-off frequency, produce at least one additional low frequency input signal from at least one of the plurality of initial low frequency input signals, and produce a plurality of high frequency input signals comprising portions of the plurality of audio input signals that are at least about the cut-off frequency;

a matrix decoder module in communication with the bass management module and configured to decode the plurality of high frequency input signals into a plurality of high frequency output signals; and a plurality of low frequency input channels in communication with the bass management module, configured to separately communicate each of the plurality of initial low frequency input signals and the additional low frequency input signal, and bypass any matrix decoder module, where the plurality of initial low frequency input signals, the at least one additional low frequency input signal, and the plurality of high frequency output signals comprise the plurality of audio output signals.

16. The system of claim 15, where the cut-off frequency comprises a frequency from about 100 Hz to about 1000 Hz.

17. The system of claim 15, further comprising an adjustment module in communication with the plurality of audio output signals and configured to customize the plurality of audio output signals for a listening environment.

18. The system of claim 15, where the matrix decoder comprises a mixer configured to produce at least one additional high frequency output signal, whereby the plurality of high frequency output signals include the additional high frequency output signals.

19. The system of claim 15, where the bass management module comprises a low-pass filter comprising the cut-off frequency, in communication with the plurality of audio input signals, and configured to produce the plurality of initial low frequency input signals.

20. The system of claim 19, where the plurality of audio input signals comprises a left-surround input signal, the low-pass filter is in communication with the left-surround input signal and configured to produce an initial left-surround low frequency input signal.

21. A system for processing a plurality of audio input signals into a plurality of audio output signals, comprising:

a bass management module in communication with the plurality of audio input signals configured to produce a plurality of low frequency input signals comprising portions of the plurality of audio input signals that are at most about a cut-off frequency, and produce a plurality of high frequency input signals comprising portions of the plurality of audio input signals that are at least about the cut-off frequency;

a matrix decoder module in communication with the bass management module and configured to decode the plurality of high frequency input signals into a plurality of high frequency output signals; and a plurality of low frequency input channels in communication with the bass management module, configured to separately communicate each of the plurality of low frequency input signals, and bypass the matrix decoder module, where the plurality of low frequency input signals and the plurality of high frequency output signals comprise the plurality of audio output signals, where the bass management module comprises a low-pass filter comprising the cut-off frequency, in communication with the plurality of audio input signals, and configured to produce a plurality of initial low frequency input signals, and where the bass management module further comprises a summation device in communication with the low-pass filter, and configured to produce one of the plurality of low frequency input signals from a subset of the plurality of initial low frequency input signals.

22. A system for processing a plurality of audio input signals into a plurality of audio output signals, comprising:

a bass management module in communication with the plurality of audio input signals configured to produce a plurality of low frequency input signals comprising portions of the plurality of audio input signals that are at most about a cut-off frequency, and produce a plurality of high frequency input signals comprising portions of the plurality of audio input signals that are at least about the cut-off frequency;

a matrix decoder module in communication with the bass management module and configured to decode the plurality of high frequency input signals into a plurality of high frequency output signals; and a plurality of low frequency input channels in communication with the bass management module, configured to separately communicate each of the plurality of low frequency input signals, and bypass the matrix decoder module, where the plurality of low frequency input signals and the plurality of high frequency output signals comprise the plurality of audio output signals, where the bass management module comprises a low-pass filter comprising the cut-off frequency, in communication with the plurality of audio input signals, and configured to produce a plurality of initial low frequency input signals, and where the plurality of audio input signals comprises a left-front input signal, a right-front input signal, and the low pass filter produces an initial left-front low frequency input signal, an initial right-front low frequency input signal, an initial center low frequency input signal, an initial left-surround low frequency input signal and an initial right-surround low frequency input signal, and the bass management system further comprises:

a first summation device in communication with and configured to produce a left-front low frequency input signal from the initial left-front, and initial center low-frequency input signals;

a second summation device in communication with and configured to produce a right-front low frequency input signal from the initial right-front and initial center low-frequency input signals;

a third summation device in communication with and configured to produce a left-side low frequency input signal from the initial left-front, initial right-front, and initial left-surround low frequency input signals; and a fourth summation device in communication with and configured to produce the a right-side low frequency input signal from the initial left-front, initial right-front, and initial right-surround low frequency input signals.

23. The system of claim 15, where the at least one additional low frequency input signal is produced from at least some of the plurality of initial low-frequency input signals.

24. The system of claim 23, where the plurality of audio input signals comprises a low-frequency effects signal, and where the at least one additional low frequency input signal is produced from the low-frequency effects signal.

25. The system of claim 15, where the bass management module comprises a high-pass filter including the cut-off frequency, is in communication with the plurality of audio input signals, and is configured to produce the plurality of high frequency input signals.

26. The system of claim 15, further comprising a mixer in communication with the plurality of initial low frequency input signals, the at least one additional low frequency signal, and the plurality of high frequency output signals, and is configured to combine the plurality of initial low frequency input signals and the at least one additional low frequency signal with the plurality of high frequency output signals.

27. A system for processing a plurality of audio input signals into a plurality of audio output signals, comprising:

a bass management module in communication with the plurality of audio input signals configured to produce a plurality of low frequency input signals comprising portions of the plurality of audio input signals that are at most about a cut-off frequency, and produce a plurality of high frequency input signals comprising portions of the plurality of audio input signals that are at least about the cut-off frequency;

a matrix decoder module in communication with the bass management module and configured to decode the plurality of high frequency input signals into a plurality of high frequency output signals;

a plurality of low frequency input channels in communication with the bass management module, configured to separately communicate each of the plurality of low frequency input signals, and bypass the matrix decoder module, where the plurality of low frequency input signals and the plurality of high frequency output signals comprise the plurality of audio output signals; and a mixer in communication with the plurality of low frequency input signals and the plurality of high frequency output signals, and is configured to combine the plurality of low frequency input signals with the plurality of high frequency output signals, where the matrix decoder comprises an adjustment module in communication with at least one of the high frequency output signal and is configured to produce at least one additional high frequency output signal.

28. A system for processing a left-front input signal and a right-front input signal into a left-front output signal, a right-front output signal, a center output signal, a left-surround output signal, and a right-surround output signal, the system comprising:

a bass management module in communication with the left-front and right-front, input signals, and comprising:

a low-pass filter in communication with, and configured to filter the left-front and right-front input signals to produce an initial left-front low frequency input signal, and an initial right-front low frequency input signal, respectively;

a first summation device in communication with the low-pass filter, configured to receive the initial left front and center low frequency input signals, and produce a further low frequency input signal; and a high-pass filter in communication with, and configured to filter the left-front and right-front input signals to produce a left-front high frequency input signal, and a right-front high frequency input signal, respectively;

a matrix decoder module in communication with the bass management module, and configured to decode the left-front, and right-front high frequency input signals into a left-front high frequency output signal, a right-front high frequency output signal, a center high frequency output signal, a left-surround high frequency output signal, and a right-surround high frequency output signal;

a plurality of low frequency input channels in communication with the bass management module, configured to separately communicate each of the left-front and right-front low frequency input signals, and bypassing the matrix decoder module; and a mixer in communication with the bass management module and the matrix decoder module and configured to produce the left-front, right-front, center, left-surround, and right-surround output signals from the left-front and right front low frequency input signals, and the left-front, right-front, center, left-surround, and right-surround high frequency output signals.

29. A vehicular sound processing system, comprising:

a signal source configured to produce a plurality of audio input signals;

a system in communication with the sound source and configured to decode the plurality of audio input signals into a plurality of audio output signals, the plurality of audio output signals being a greater number than the plurality of audio input signals, the system comprising:

a bass management module in communication with the plurality of audio input signals, configured to produce a plurality of initial low frequency input signals comprising portions of the plurality of audio input signals that are at most about a cut-off frequency, an additional plurality of low frequency input signals from the plurality of initial low frequency input signals, and n high frequency input signals comprising portions of the plurality of audio input signals that are at least about the cut-off frequency;

at least one matrix decoder module in communication with the bass management module and configured to decode the plurality of high frequency input signals into a plurality of high frequency output signals, the plurality of high frequency output signals being a greater number than the plurality of high frequency input signals;

a plurality of low frequency input channels in communication with the bass management module configured to separately communicate each of the plurality of initial low frequency input signals and the additional plurality of low frequency input signals, and bypass any matrix decoder module, where the plurality of initial low frequency input signals, the additional plurality of low frequency input signals, and the plurality of high frequency output signals comprise the plurality of audio output signals; and a plurality of speakers in communication with the system and configured to convert the plurality of output signals into a plurality of sound waves.

30. A vehicular sound processing system, comprising:

a signal source configured to produce a plurality of audio input signals;

a system in communication with the sound source and configured to decoding the plurality of audio input signals into a plurality of audio output signals, the system comprising:

bass management means for producing a plurality of initial low-frequency input signals that include portions of the plurality of audio input signals that are at most about a cut-off frequency, an additional plurality of low frequency input signals from the plurality of initial low frequency input signals, and a plurality of high-frequency input signals that include portions of the plurality of audio input signals that are at least about the cut-off frequency;

matrix decoder means for decoding the plurality of high frequency input signals into a plurality of high frequency output signals; and means for separately communicating each of the plurality of initial low frequency input signals and the additional m-n low frequency input signals, and bypassing any matrix decoder means, where the n initial low frequency input signals, the additional plurality of low frequency input signals, and the plurality of high frequency output signals comprise the plurality of audio output signals; and a plurality of speakers in communication with the system, where the plurality of speakers converts the plurality of output signals into a plurality of sound waves.

31. A method for processing a plurality of audio input signals into a plurality of audio output signals, the plurality of audio output signals being a greater number than the plurality of audio input signals, the method comprising:

producing a plurality of initial low frequency input signals that comprises portions of at least some of the plurality of audio input signals that is at most about a cut-off frequency;

producing at least one additional low frequency input signal as a function of at least one of the plurality of initial low frequency input signals;

decoding, according to at least one matrix decoding technique, at least a part of the plurality of audio input signals into a plurality of decoded signals;

bypassing the plurality of initial low frequency input signals and the at least one additional low frequency input signal by any matrix decoding technique; and generating the plurality of audio output signals based on the plurality of decoded signals, based on the at least one additional low frequency signal, and based on the plurality of initial low frequency input signals.

32. The method of claim 31, where producing a plurality of initial low frequency input signals comprises producing a plurality of initial low frequency input signals that comprise portions of the plurality of audio input signals that are at most about a cut-off frequency; and where bypassing comprises bypassing the plurality of initial low frequency input signals and the at least one additional low frequency input signal by any matrix decoding technique.

33. The method of claim 32, where a number of the plurality of audio input signals is less than a number of the plurality of initial low frequency input signals and the at least one additional low frequency input signal.

34. The method of claim 33, where the function comprises a summation.

35. The method of claim 32, where a number of the plurality of initial low frequency input signals equals the number of the plurality of audio input signals; and where the plurality of initial low frequency input signals is generated by filtering the plurality of audio input signals.

36. A method for processing a plurality of audio input signals into a plurality of audio output signals, the method comprising:

producing at least one low frequency input signal that comprises a portion of at least one of the plurality of audio input signals that is at most about a cut-off frequency;

decoding, according to at least one matrix decoding technique, at least a part of the plurality of audio input signals into a plurality of decoded signals;

bypassing the at least one low frequency input signal by any matrix decoding technique; and generating the plurality of audio output signals based on the plurality of decoded signals and based on the at least one low frequency input signal, where decoding comprises decoding from a lesser number of input signals to a greater number of decoded signals;

where a number of low frequency input signals is equal to the number of decoded signals;

where each of the plurality of low frequency input signals are maintained separately from each other; and where the low frequency input signals are combined with corresponding decoded signals to generate the plurality of audio output signals.

37. The method of claim 31, where decoding comprises decoding from a lesser number of input signals to a greater number of decoded signals;

where a number of the plurality of initial low frequency input signals is less than the number of decoded signals; and where each of the plurality of initial low frequency input signals are maintained separately from each other; and where the plurality of initial low frequency input signals are combined with some of the corresponding decoded signals to generate some of the plurality of audio output signals.

38. The method of claim 31, further comprising producing a plurality of high frequency input signals that comprises portions of the plurality of audio input signals that are at least about the cut-off frequency; and where decoding comprises decoding the plurality of high frequency input signals to generate the plurality of decoded signals.

39. A method for processing a plurality of audio input signals into a plurality of audio output signals, the plurality of audio output signals being a greater number than the plurality of audio input signals, the method comprising:

producing an initial plurality of low frequency input signals by removing frequencies that are above about the cut-off frequency from at least some of the plurality of audio input signals;

producing at least one low frequency input signal as a function of the initial low frequency input signals;

decoding, according to at least one matrix decoding technique, at least a part of the plurality of audio input signals into a plurality of decoded signals;

bypassing the at least one low frequency input signal and the initial plurality of low frequency input signals by the matrix decoding technique; and generating the plurality of audio output signals based on the plurality of decoded signals and based on the at least one low frequency input signal and at least one of the initial plurality of low frequency input signals.

40. The method of claim 39, where producing a plurality of low frequency input signals as a function of the initial low frequency input signals comprising summing at least two of the initial plurality of low frequency input signals.

41. A method for processing a plurality of audio input signals into a plurality of audio output signals, the method comprising:

producing an initial plurality of low frequency input signals by removing frequencies that are above about the cut-off frequency from at least some of the plurality of audio input signals;

producing a plurality of low frequency input signals as a function of the initial low frequency input signals;

decoding, according to at least one matrix decoding technique, at least a part of the plurality of audio input signals into a plurality of decoded signals;

bypassing the plurality of low frequency input signals by the matrix decoding technique; and generating the plurality of audio output signals based on the plurality of decoded signals and based on the plurality of low frequency input signals, where one of the plurality of low frequency input signals includes a SUB signal comprising a summation of all of the initial low frequency input signals.

42. A vehicular sound processing system, comprising:

a signal source configured to produce a plurality of audio input signals;

a system in communication with the sound source and configured to decode the plurality of audio input signals into a plurality of audio output signals, the plurality of audio output signals being a greater number than the plurality of audio input signals, the system comprising:

a bass management module in communication with the plurality of audio input signals, configured to produce a plurality of initial low frequency input signals that comprises a portion of at least some of the plurality of audio input signals that is at most about a cut-off frequency and configured to produce at least one additional low frequency input signal as a function of at least one of the plurality of initial low frequency input signals;

at least one matrix decoder module in communication with the bass management module and configured to decode at least a part of the plurality of audio input signals into a plurality of decoded signals; and a plurality of low frequency input channels in communication with the bass management module configured to bypass the plurality of initial low frequency input signals and the at least one additional low frequency input signal from any matrix decoder module, where the plurality of initial low frequency input signals, the at least one additional low frequency input signal, and the plurality of decoded signals comprise the plurality of audio output signals; and a plurality of speakers in communication with the system and configured to convert the plurality of audio output signals into a plurality of sound waves.

43. The vehicular sound processing system of claim 42, where the bass management module is configured to produce the plurality of initial low frequency input signals that comprise portions of the plurality of audio input signals that are at most about a cut-off frequency; and where the plurality of low frequency input channels comprises a plurality of low frequency input channels configured to bypass the plurality of initial low frequency input signals and the at least one additional low frequency input signal by any matrix decoding technique.

44. The vehicular sound processing system of claim 43, where a number of the plurality of audio input signals is less than a number of the plurality of initial low frequency input signals.

45. The vehicular sound processing system of claim 44, where the function comprises a summation.

46. The vehicular sound processing system of claim 43, where a number of the plurality of initial low frequency input signals equals a number of the plurality of audio input signals; and where the plurality of initial low frequency input signals is generated by filtering the plurality of audio input signals.

47. A vehicular sound processing system, comprising:

a signal source configured to produce a plurality of audio input signals;

a system in communication with the sound source and configured to decode the plurality of audio input signals into a plurality of audio output signals, the system comprising:

a bass management module in communication with the plurality of audio input signals, configured to produce at least one low frequency input signal that comprises a portion of at least one of the plurality of audio input signals that is at most about a cut-off frequency;

at least one matrix decoder module in communication with the bass management module and configured to decode at least a part of the plurality of audio input signals into a plurality of decoded signals; and at least one low frequency input channel in communication with the bass management module configured to bypass the at least one low frequency input signal from any matrix decoder module, where the at least one low frequency input signal and the plurality of decoded signals comprise the plurality of audio output signals; and a plurality of speakers in communication with the system and configured to convert the plurality of audio output signals into a plurality of sound waves, where the matrix decoder is configured to decode from a lesser number of input signals to a greater number of decoded signals;

where the number of low frequency input signals is equal to the number of decoded signals;

where each of the plurality of low frequency input signals are maintained separately from each other; and where the low frequency input signals are combined with corresponding decoded signals to generate the plurality of audio output signals.

48. The vehicular sound processing system of claim 42, where the number of the plurality of initial low frequency input signals is less than the number of decoded signals; and where each of the plurality of initial low frequency input signals are maintained separately from each other; and where the plurality of initial low frequency input signals are combined with some of the corresponding decoded signals to generate some of the plurality of audio output signals.

49. The vehicular sound processing system of claim 42, further comprising producing a plurality of high frequency input signals that comprises portions of the plurality of audio input signals that are at least about the cut-off frequency; and where decoding comprises decoding the plurality of high frequency input signals to generate the plurality of decoded signals.

50. A vehicular sound processing system, comprising:

a signal source configured to produce a plurality of audio input signals;

a system in communication with the sound source and configured to decode the plurality of audio input signals into a plurality of audio output signals, the plurality of audio output signals being a greater number than the plurality of audio input signals, the system comprising:

a bass management module in communication with the plurality of audio input signals, configured to produce a plurality of initial low frequency input signals by removing frequencies that are above about the cut-off frequency from at least some of the plurality of audio input signals and to produce a plurality of additional low frequency input signals as a function of the initial low frequency input signals;

at least one matrix decoder module in communication with the bass management module and configured to decode at least a part of the plurality of audio input signals into a plurality of decoded signals; and a plurality of low frequency input channels in communication with the bass management module configured to bypass the plurality of initial low frequency input signals and the plurality of additional low frequency input signals from any matrix decoder module, where the plurality of initial low frequency input signals, the plurality of additional low frequency input signals, and the plurality of decoded signals comprise the plurality of audio output signals; and a plurality of speakers in communication with the system and configured to convert the plurality of audio output signals into a plurality of sound waves.

* * * * *

UNITED STATES PATENT AND TRADEMARK OFFICE

CERTIFICATE OF CORRECTION

PATENT NO. : 7,391,869 B2
APPLICATION NO. : 10/606623
DATED : June 24, 2008
INVENTOR(S) : Bradley F. Eid et al.

It is certified that error appears in the above-identified patent and that said Letters Patent is hereby corrected as shown below:

In the Title

Delete "BASE MANAGEMENT" and substitute --BASS MANAGEMENT-- in its place.

In the Claims

In column 32, claim 22, line 65, after "configured to produce" delete "the".

In column 34, claim 30, line 65, after "configured to" delete "decoding" and substitute --decode-- in its place.

Signed and Sealed this

Twenty-first Day of April, 2009

John Doll

JOHN DOLL
*Acting Director of the United States Patent and Trademark Office*

UNITED STATES PATENT AND TRADEMARK OFFICE

CERTIFICATE OF CORRECTION

PATENT NO. : 7,391,869 B2
APPLICATION NO. : 10/606623
DATED : June 24, 2008
INVENTOR(S) : Bradley F. Eid et al.

It is certified that error appears in the above-identified patent and that said Letters Patent is hereby corrected as shown below:

In the Title, Title Page, Item (54) and Column 1, line 1

Delete “BASE MANAGEMENT” and substitute --BASS MANAGEMENT-- in its place.

In the Claims

In column 32, claim 22, line 65, after “configured to produce” delete “the”.

In column 34, claim 30, line 65, after “configured to” delete “decoding” and substitute --decode-- in its place.

This certificate supersedes the Certificate of Correction issued April 21, 2009.

Signed and Sealed this

Twelfth Day of May, 2009

JOHN DOLL

*Acting Director of the United States Patent and Trademark Office*